(12) United States Patent
Majhi et al.

(10) Patent No.: US 12,414,366 B2
(45) Date of Patent: Sep. 9, 2025

(54) CO-INTEGRATION OF HIGH VOLTAGE (HV) AND LOW VOLTAGE (LV) TRANSISTOR STRUCTURES, USING CHANNEL HEIGHT AND SPACING MODULATION

(71) Applicant: Intel Corporation, Santa Clara, CA (US)

(72) Inventors: Prashant Majhi, San Jose, CA (US); Anand Murthy, Portland, OR (US); Glenn Glass, Portland, OR (US); Rushabh Shah, Hillsboro, OR (US); Susmita Ghose, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 750 days.

(21) Appl. No.: 17/557,517

(22) Filed: Dec. 21, 2021

(65) Prior Publication Data

US 2023/0197724 A1 Jun. 22, 2023

(51) Int. Cl.
*H01L 27/092* (2006.01)
*H01L 21/02* (2006.01)
(Continued)

(52) U.S. Cl.
CPC ....... *H10D 84/856* (2025.01); *H01L 21/0259* (2013.01); *H10D 30/031* (2025.01);
(Continued)

(58) Field of Classification Search
CPC .............. H10D 84/856; H10D 30/031; H10D 30/6713; H10D 30/6735; H10D 30/6757; H10D 62/118; H10D 64/017; H10D 84/0167; H10D 84/017; H10D 84/0186; H10D 84/038; H10D 64/252;
(Continued)

(56) References Cited

U.S. PATENT DOCUMENTS

2018/0254322 A1 9/2018 Cheng et al.
2019/0371888 A1* 12/2019 Zhang ................. H10D 30/792
(Continued)

OTHER PUBLICATIONS

Partial European Search Report received for EP Application No. 22205708.5 dated May 19, 2023. 13 pages.
(Continued)

*Primary Examiner* — Tong-Ho Kim
(74) *Attorney, Agent, or Firm* — Finch & Maloney PLLC

(57) ABSTRACT

An integrated circuit structure includes a first non-planar semiconductor device and a second non-planar semiconductor device. The first non-planar semiconductor device includes a first body, a first gate structure at least in part wrapped around the first body, and a first source region and a first drain region. The first body extends laterally between the first source and first drain regions. The second non-planar semiconductor device comprises a second body, a second gate structure at least in part wrapped around the second body, and a second source region and a second drain region. The second body extends laterally between the second source and second drain regions. In an example, a first height of the first body is at least 5% different from a second height of the second body. Each of the first and second bodies can be, for instance, a nanoribbon, nanosheet, or nanowire.

20 Claims, 18 Drawing Sheets

(51) Int. Cl.
   *H01L 21/8238* (2006.01)
   *H01L 29/06* (2006.01)
   *H01L 29/423* (2006.01)
   *H01L 29/66* (2006.01)
   *H01L 29/786* (2006.01)
   *H10D 30/01* (2025.01)
   *H10D 30/67* (2025.01)
   *H10D 62/10* (2025.01)
   *H10D 64/01* (2025.01)
   *H10D 84/01* (2025.01)
   *H10D 84/03* (2025.01)
   *H10D 84/85* (2025.01)

(52) U.S. Cl.
   CPC ..... *H10D 30/6713* (2025.01); *H10D 30/6735* (2025.01); *H10D 30/6757* (2025.01); *H10D 62/118* (2025.01); *H10D 64/017* (2025.01); *H10D 84/0167* (2025.01); *H10D 84/017* (2025.01); *H10D 84/0186* (2025.01); *H10D 84/038* (2025.01)

(58) Field of Classification Search
   CPC .. H10D 84/201; H10D 1/694; H10D 84/0107; H01L 21/0259; A61K 40/4218; H02K 15/027; H10F 77/955; H10F 30/2863; H10H 20/826; A01G 13/33; A23B 2/783; A45C 11/003; B82Y 10/00
   USPC ......................................................... 257/351
   See application file for complete search history.

(56) References Cited

U.S. PATENT DOCUMENTS

2020/0287046 A1\* 9/2020 Frougier ............ H10D 84/0142
2021/0066137 A1\* 3/2021 Hsu .................. H01L 21/28185
2021/0083055 A1 3/2021 Liaw

OTHER PUBLICATIONS

Extended European Search Report received for EP Application No. 22205708.5 dated Aug. 21, 2023. 12 pages.

\* cited by examiner

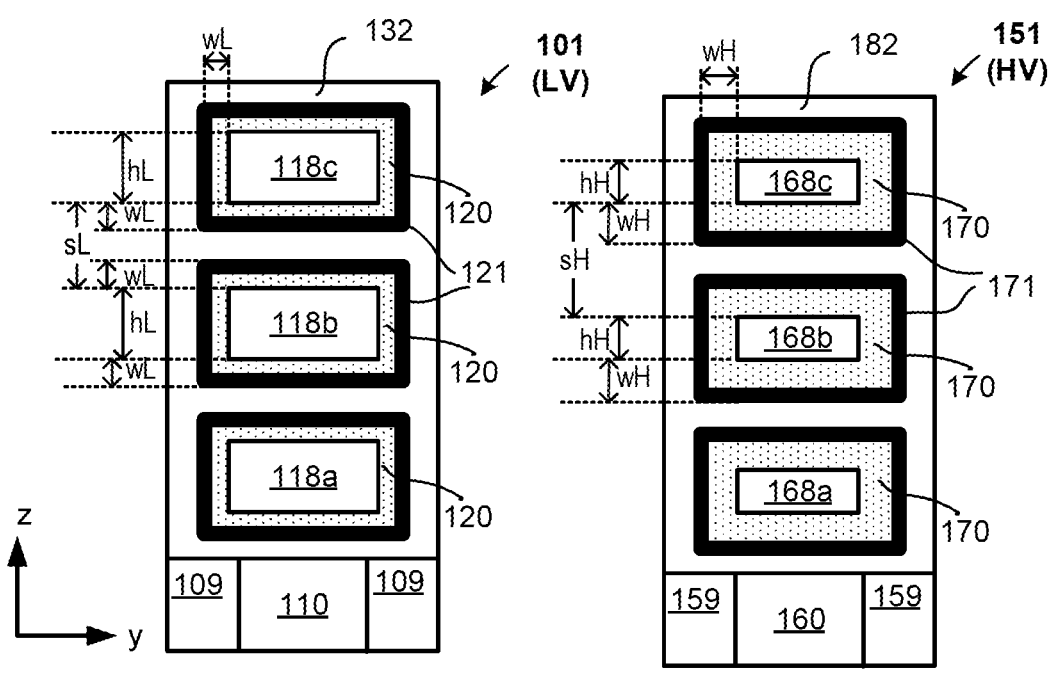
FIG. 1B1

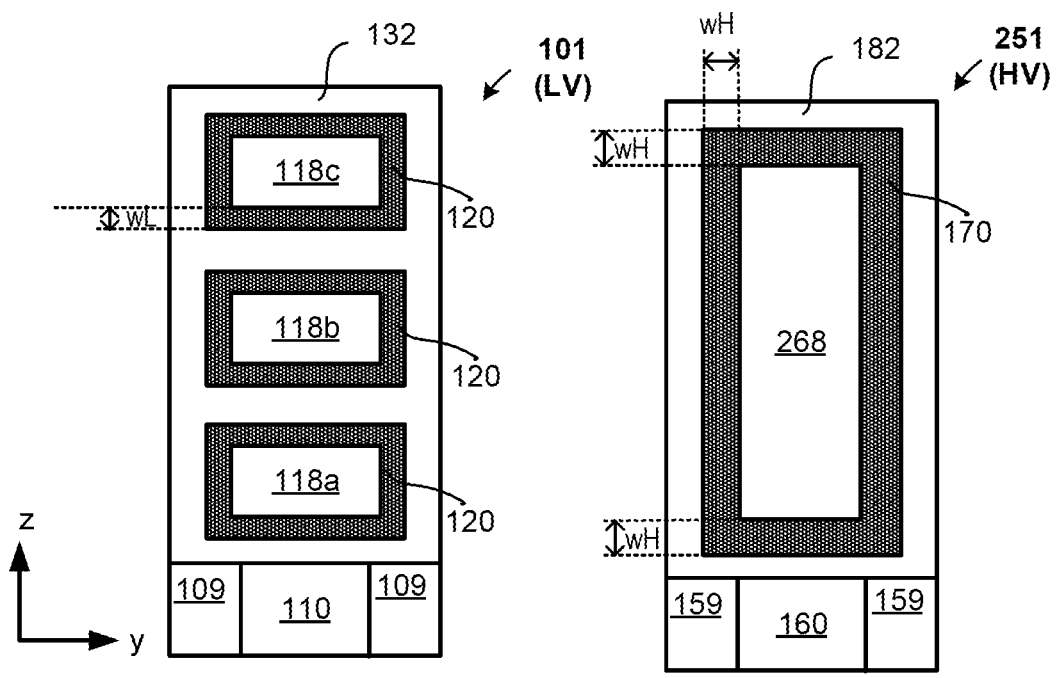
FIG. 2B1
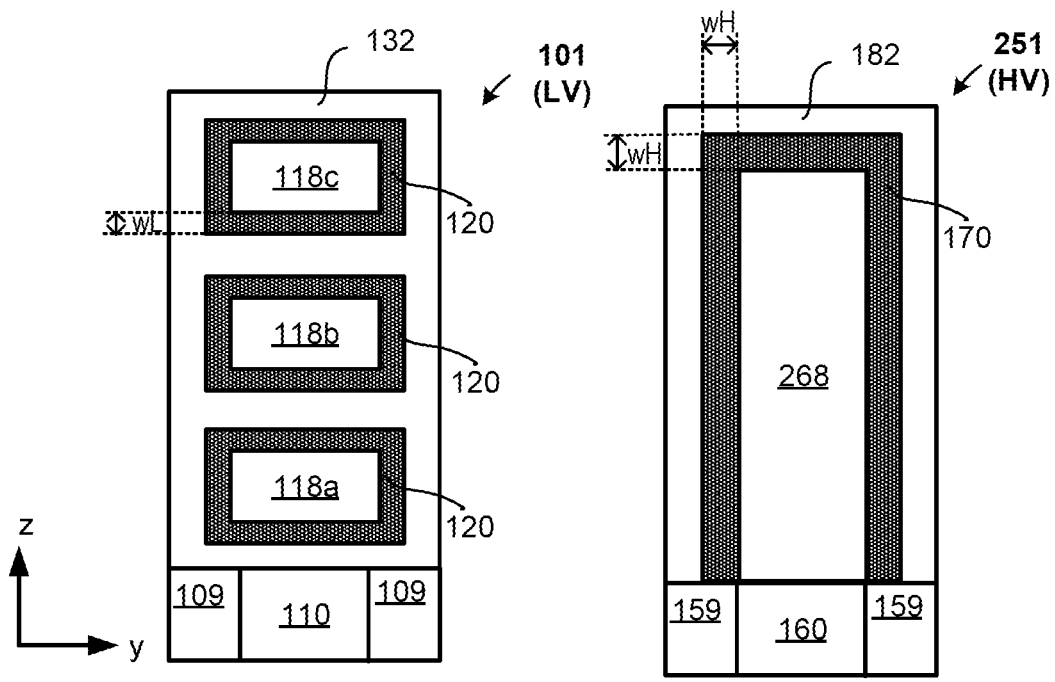
FIG. 2B2

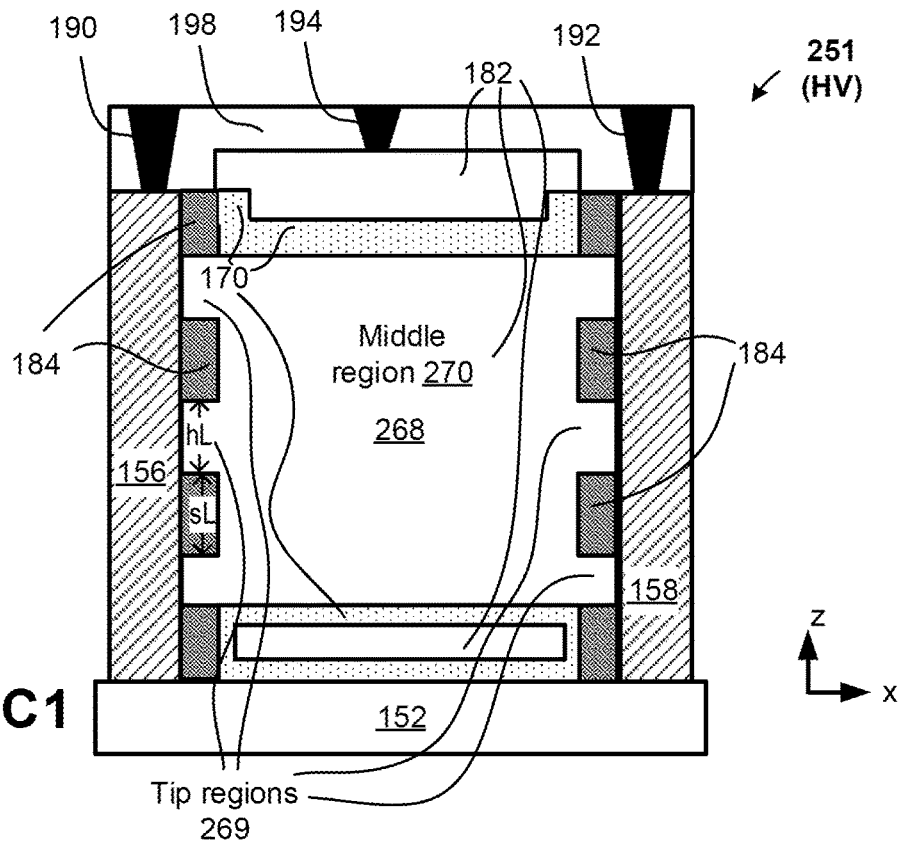
FIG. 2C1
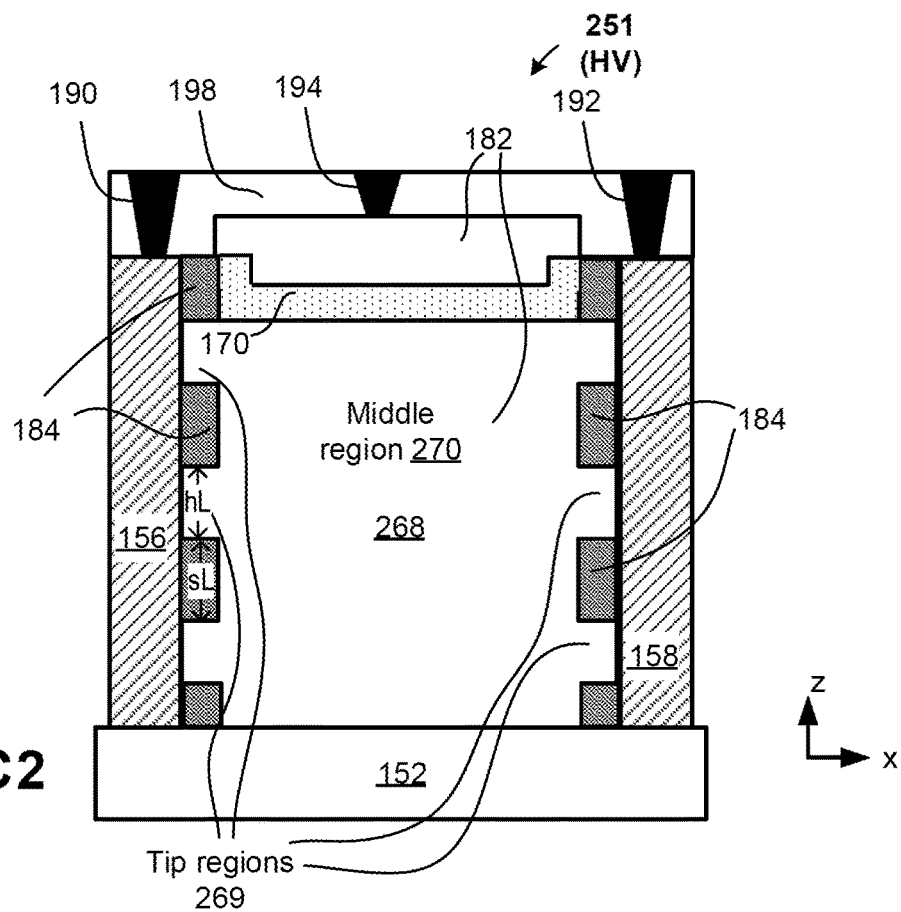
FIG. 2C2

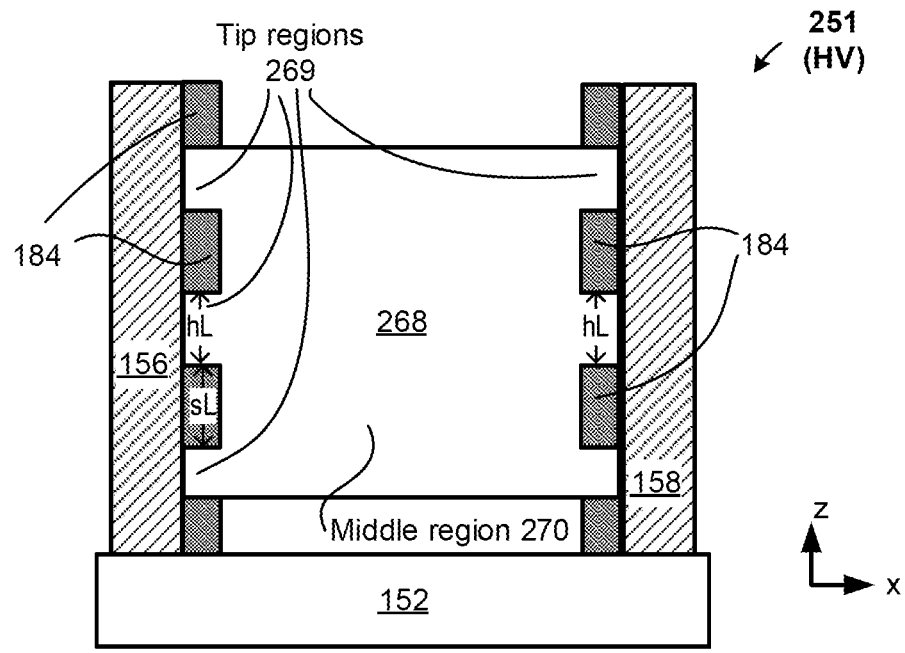
FIG. 6B1
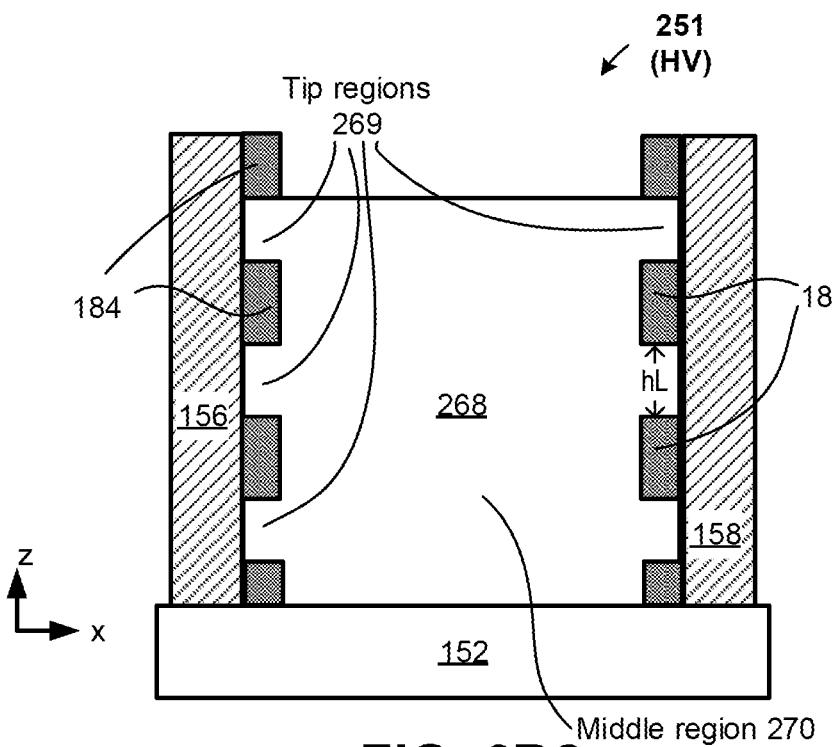
FIG. 6B2

CO-INTEGRATION OF HIGH VOLTAGE (HV) AND LOW VOLTAGE (LV) TRANSISTOR STRUCTURES, USING CHANNEL HEIGHT AND SPACING MODULATION

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device; and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A nanowire transistor (sometimes referred to as a gate-all-around (GAA) or nanoribbon transistor) is configured similarly to a fin-based transistor, but instead of a finned channel region, one or more nanowires extend between the source and the drain regions. In nanowire transistors the gate material wraps around each nanowire (hence, gate-all-around).

BRIEF DESCRIPTION OF THE DRAWINGS

FIGS. 1A, 1B, 1B1, and 1C illustrate various views of a low voltage (LV) non-planar device and a high voltage (HV) non-planar device of an integrated circuit, where a height of channel body of the LV non-planar device is greater than a height of channel body of the HV non-planar device, in accordance with an embodiment of the present disclosure.

FIGS. 2A, 2B1, 2B2, 2C1, 2C2 illustrate various views of a LV non-planar device and a HV non-planar device of an integrated circuit, where a height of channel body of the LV non-planar device is less than a height of channel body of the HV non-planar device, in accordance with an embodiment of the present disclosure.

FIGS. 6A, 6B1, and 6B2 illustrate cross-sectional views of an example non-planar LV device and HV device in various stages of processing, in accordance with an embodiment of the present disclosure.

Figure 1A:
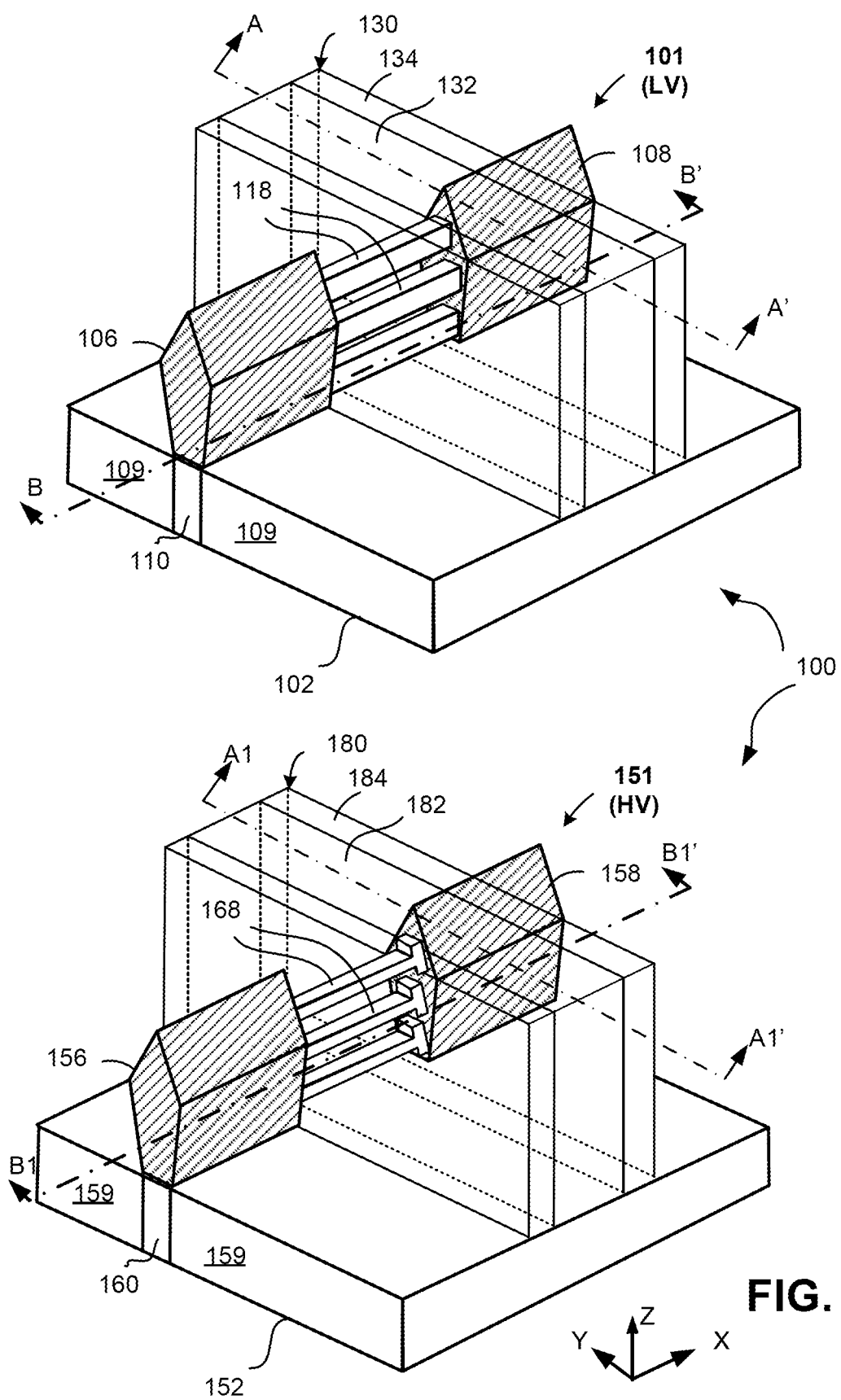

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles (e.g., curved or tapered sidewalls and round corners), and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Integrated circuit structures including transistor devices having variable channel thickness and spacing are provided herein. The techniques can be used in a number of transistor technologies, but are particularly useful in gate-all-around process flows that include both high voltage (HV) transistors and low voltage (LV) transistors. In an example, a width of gate dielectric layer of a HV transistor is greater than a width of a gate dielectric layer of a LV transistor, owing to the higher voltage rating of the HV transistor. However, in general, in a HV GAA transistor, there may not be sufficient spacing between channel bodies (such as nanoribbons, nanowires, or nanosheets) to accommodate the thicker gate dielectric. This problem is particularly difficult as transistor size continues to scale downward. Accordingly, in one example embodiment, semiconductor channel bodies of a HV GAA transistor are selectively thinned, e.g., to generate sufficient spacing between the channel bodies to accommodate the thicker gate dielectric. In another example embodiment, semiconductor channel bodies of a HV transistor are selectively thickened and merged to form a single channel body, e.g., to eliminate spacing between the individual bodies and effectively convert them to a monolithic fin structure, thus eliminating the need of gate dielectric between the individual channel bodies.

In one embodiment, an integrated circuit structure comprises a first non-planar semiconductor device and a second non-planar semiconductor device. The first non-planar semiconductor device comprises a first body including a semiconductor material, a first gate structure at least in part wrapped around the first body, the first gate structure including (i) a first gate electrode and (ii) a first gate dielectric between the first body and the first gate electrode, and a first source region and a first drain region. In an example, the first body has a length that extends laterally between the first source and first drain regions. The second non-planar semiconductor device comprises a second body including a semiconductor material, a second gate structure at least in part wrapped around the second body, the second gate structure including (i) a second gate electrode and (ii) a second gate dielectric between the second body and the second gate electrode, and a second source region and a second drain region. In an example, the second body has a length that extends laterally between the second source and second drain regions. In an example, a first height of the first body is different from a second height of the second body. Note that a body's height is perpendicular to its length. The first height may be measured, for instance, under the first gate structure and in a vertical direction that is perpendicular to the length of the first body, and the second height may be measured under the second gate structure and in a vertical direction that is perpendicular to the length of the second body.

In another embodiment, a semiconductor structure comprises a body comprising a semiconductor material; and a gate structure at least in part wrapped around the body. In an example, the gate structure includes (i) a gate electrode and (ii) a gate dielectric between the body and the gate electrode. In an example, the body laterally extends between a source region and a drain region. A gate spacer is between the gate electrode and the source region. The body comprises a plurality of tip regions that extend from and, are continuous with, a middle region of the body. In an example, at least a first tip region and a second tip region of the plurality of tip regions are (i) in direct contact with the source or drain region, and (ii) separated by a portion of the gate spacer. So, for instance, an imaginary vertical line will pass through each of the first tip region, the second tip region, and the portion of the gate spacer.

In yet another example embodiment, a semiconductor structure comprises a body comprising a semiconductor material, the body including a first tip region, a second tip region, and a middle region between the first and second tip regions. A gate structure is at least in part wrapped around the body, the gate structure including (i) a gate electrode and (ii) a gate dielectric between the body and the gate electrode. In an example, the body laterally extends between a source region and a drain region, and the first and second tip regions of the body are in direct contact with the source and drain regions, respectively. In an example, a first height of the first tip region in contact with the source region is at least 5% more than a second height of the middle region. The first and second heights can be measured, for example, at first and second locations along the body which are under the gate structure.

In a further example embodiment, a method of forming an integrated circuit structure comprising a high voltage (HV) device and a low voltage (LV) device is disclosed. The method comprises forming (i) for the LV device, a first plurality of bodies, and a first source region and a first drain region on two sides of the first plurality of bodies, and (ii) for the HV device, a second plurality of bodies, and a second source region and a second drain region on two sides of the second plurality of bodies. In an example, the method includes thinning each of the second plurality of bodies to form a corresponding plurality of thinned bodies, without thinning the first plurality of bodies. In an example, the method further includes forming (i) for the LV device, a first gate structure that at least in part wraps the first plurality of bodies, and (ii) for the HV device, a second gate structure that at least in part wraps the plurality of thinned bodies.

In yet another example embodiment, a method of forming an integrated circuit structure comprising a high voltage (HV) device and a low voltage (LV) device is disclosed. The method includes forming (i) for the LV device, a first plurality of bodies, and a first source region and a first drain region on two sides of the first plurality of bodies, and (ii) for the HV device, a second plurality of bodies, and a second source region and a second drain region on two sides of the second plurality of bodies. In an example, the method includes depositing semiconductor material in a channel region of the HV device, to merge the second plurality of bodies and form a merged body, without depositing the semiconductor material in a channel region of the LV device. In an example, the method includes forming (i) for the LV device, a first gate structure that at least in part wraps the first plurality of bodies, and (ii) for the HV device, a second gate structure that at least in part wraps the merged body.

Numerous variations, embodiments, and applications will be apparent in light of the present disclosure.

General Overview

Field effect transistors (FETs) have been scaled to smaller and smaller sizes to achieve faster circuit operation. Such scaling has resulted in the development of gate-all-around (GAA) transistors, examples of which include nanowire or nanoribbon transistors. For example, the GAA channel region can have a vertical stack of nanoribbons that extend horizontally between the source and drain regions, and a gate structure that is between the source and drain regions and wraps around the nanoribbons. An integrated circuit (IC) may include HV GAA transistors and LV GAA transistors. In such GAA transistors, a gate structure includes a gate electrode and a gate dielectric that at least in part wraps around individual channel bodies (e.g., a nanoribbon, a nanowire, or a nanosheet). The gate dielectric is between the gate electrode and the channel bodies. The width of the gate dielectric layer of a HV transistor is greater than a width of a gate dielectric layer of a LV transistor, owing to the higher voltage rating of the HV transistor. However, as transistor scaling continues, in a HV transistor, there may not be sufficient spacing between the channel bodies to accommodate the thicker gate dielectric of the HV transistor.

Accordingly, techniques are provided herein to co-integrate HV and LV transistors into an integrated circuit. In one example embodiment, the channel bodies of a HV transistor are thinned. In some examples, the thinning process involves conformally thinning middle regions of the channel bodies of the HV transistor (e.g., atomic layer etch). Note that the tip regions of the channel bodies of the HV transistor are surrounded by gate spacers, which protects the tip regions from the thinning process. Hence, the thinning process selectively narrows the middle regions of the channel bodies of the HV transistor, without thinning the tip regions. The tip regions thus have a dumb-bell like profile. Accordingly, inter-body spacing (vertical spacing between two adjacent channel bodies) in the middle regions of the HV transistor increases and is now greater than the inter-body spacing in the middle regions of the LV transistor. The increased inter-body spacing in the middle regions of the HV transistor is now sufficient to accommodate the relatively thicker gate dielectric of the HV transistor.

Note that the original height (e.g., prior to the thinning process) of the channel bodies of the LV and HV transistors may be are the same, as the channel bodies of the two transistors may be formed using the same process flow, according to some embodiments. The thinning process selectively reduces the height of the middle regions of the channel bodies of the HV transistor, without reducing the height of the tip regions of the channel bodies of the HV transistor, and also without reducing the height of the channel bodies of the LV transistor. Accordingly, after the thinning process, the height of the middle regions of the channel bodies of the LV transistor is more (e.g., at least 5% or at least 10% more or at least 20% more) than the height of the middle regions of the channel bodies of the HV transistor. The height of the tip regions of the channel bodies of the HV transistor remains the same (e.g., within 10%, 5%, 2%, or 1%) as the height of the channel bodies of the LV transistor.

Furthermore, the inter-body spacing in the middle regions of the HV transistor is now greater (e.g., at least 10% more) than the inter-body spacing in the middle regions of the LV transistor. For example, the increased inter-body spacing in the middle regions of the HV transistor is now sufficient to accommodate the relatively thicker gate dielectric of the HV transistor.

In another example embodiment, instead of thinning the channel bodies, the channel bodies of the HV transistor are thickened and merged to form a single channel body. For example, atomic layer epitaxy or chemical vapor deposition or other conformal deposition technique is used to deposit semiconductor material in the channel region, which deposits semiconductor material on the channel bodies of the HV transistor. This results in merging of the multiple channel bodies and formation of a single merged or monolithic channel body in the channel region. This eliminates any spacing between multiple channel bodies in the HV transistor, thereby eliminating need of gate dielectric between such multiple channel bodies. The body can thus be used as a fin structure (e.g., for tri-gate or finFET transistors) rather than, for instance, nanoribbons or nanosheets.

Note that the thickening and deposition process do not affect the tip regions of the channel bodies of the HV transistor, which are protected by the gate spacers during the deposition process. Accordingly, the tip regions of the merged channel body of the HV transistor have a height that is same as (e.g., within 10%, 5%, 2%, or 1%) a height of the channel bodies of the LV transistor. In contrast, the middle region of the merged channel body of the HV transistor has a height that is at least 200% more (e.g., if two channel bodies are merged) or at least 300% more (e.g., if three channel bodies are merged, etc.) than a height of individual channel bodies of the LV transistor.

Thus, the techniques disclosed herein allows for formation of relatively thicker gate dielectric for HV transistors, while maintaining relatively low-width gate dielectric for LV transistors. This allows high performance of both p-type and n-type MOSFET for the HV transistors and maintaining low parasitic capacitance in the HV transistors.

Note that in this disclosure, a first height of a structure (or a first vertical spacing between two structures) may be disclosed to be same as a second height of another structure (or a second vertical spacing between other two structures). This does not imply that the first height and the second height (or the first and second vertical spacings) have to be exactly the same. For example, because of limitations of the formation process, there may be some difference between the first height and the second height (or the first and second vertical spacings). In general, a first height being disclosed to be same as a second height (or a first vertical spacing being disclosed to be same as a second vertical spacing) implies that the two heights (or the two vertical spacings) may be within 5% of each other. In some specific such example embodiments, the heights are within 2% of each other or within 1% of each other.

Similarly, a first height being disclosed to be different from a second height (or a first vertical spacing being disclosed to be different from a second vertical spacing) implies that the two heights (or the two vertical spacings) may be at least 10% different from each other. In some specific such example embodiments, the heights are at least 15% or 20% or 50% different from each other.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different than silicon), or by way of one material having all the same elements as a second material but at least one of those elements is intentionally provided at a different concentration in one material relative to the other material (e.g., SiGe having 70 atomic percent germanium is compositionally different than from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon. Creating a stack of different orientations could be accomplished, for instance, with blanket wafer layer transfer. If two materials are elementally different, then one of the materials has an element that is not in the other material.

Note that the use of "source/drain" herein is simply intended to refer to a source region or a drain region or both a source region and a drain region. To this end, the forward slash ("/") as used herein means "and/or" unless otherwise specified, and is not intended to implicate any particular structural limitation or arrangement with respect to source and drain regions, or any other materials or features that are listed herein in conjunction with a forward slash.

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. In particular, in some embodiments, such tools may be used to measure shape and relative heights of the channel bodies, and relative inter-channel body spacing of the channel bodies of HV and LV transistors. Such analysis tools may also be used to identify a seam where two semiconductor bodies of like material merged to form a monolithic structure.

Numerous configurations and variations will be apparent in light of this disclosure.

Architecture and Methodology

Figure 1B:
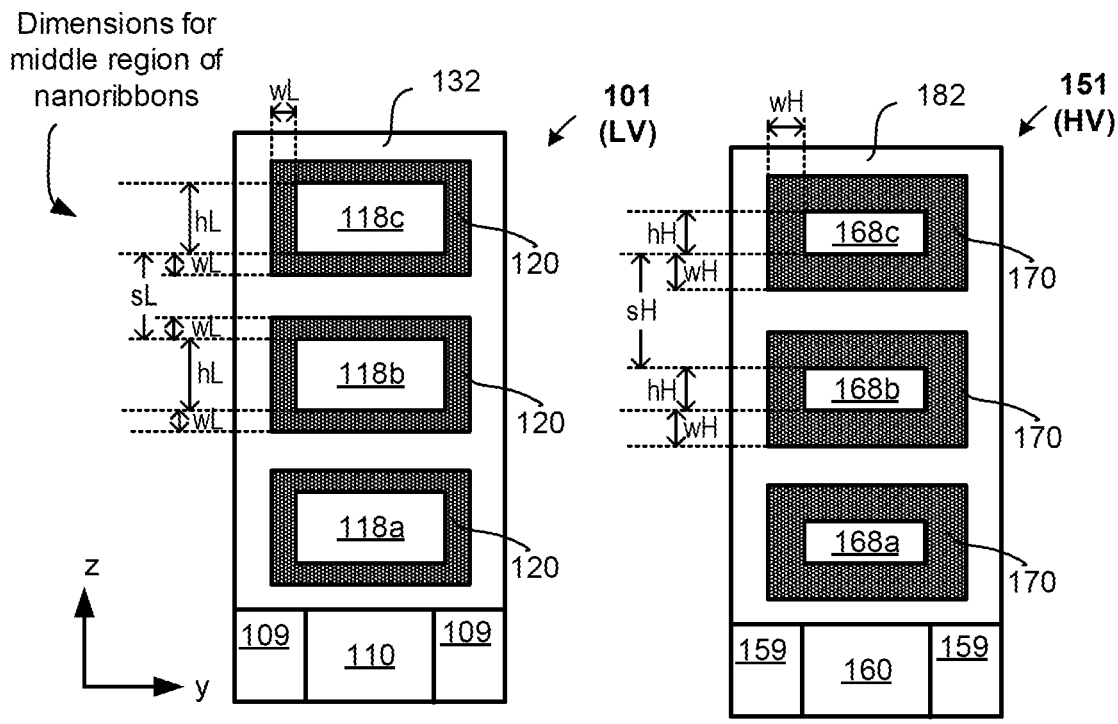
Figure 1D:
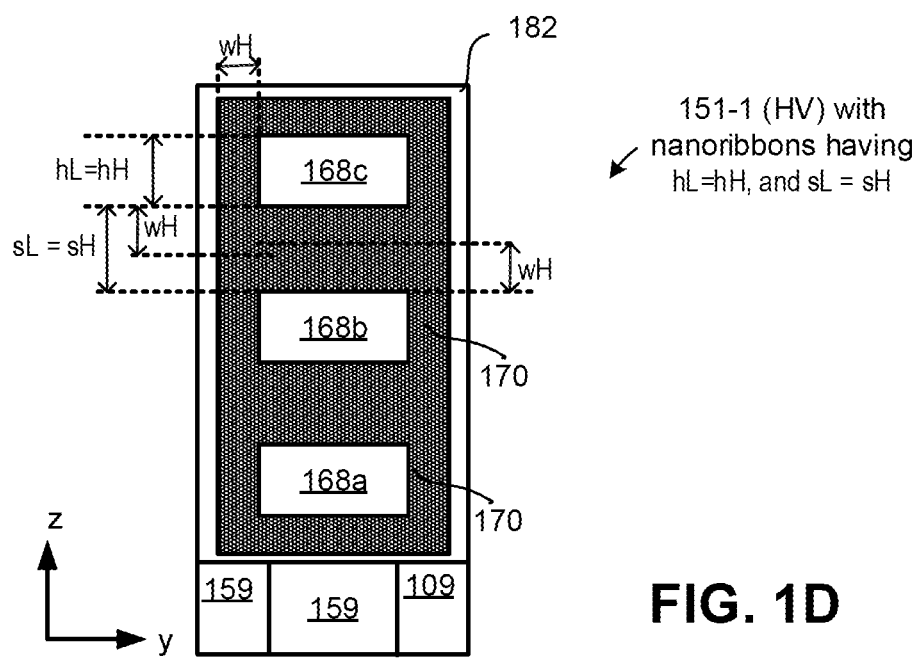
FIG. 1D illustrates a scenario where a height of a nanoribbon middle-region and vertical spacing between middle regions of adjacent nanoribbons in a HV device are the same as those of the LV device of FIGS. 1A, 1B, and 1C, in accordance with an embodiment of the present disclosure.
Figure 1C:
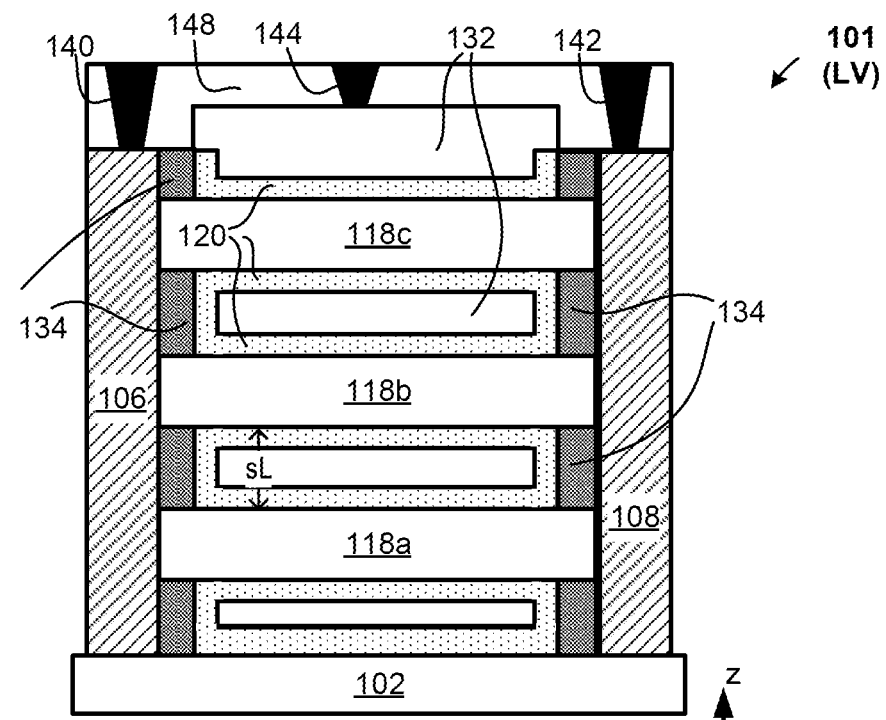
Figure 1C:
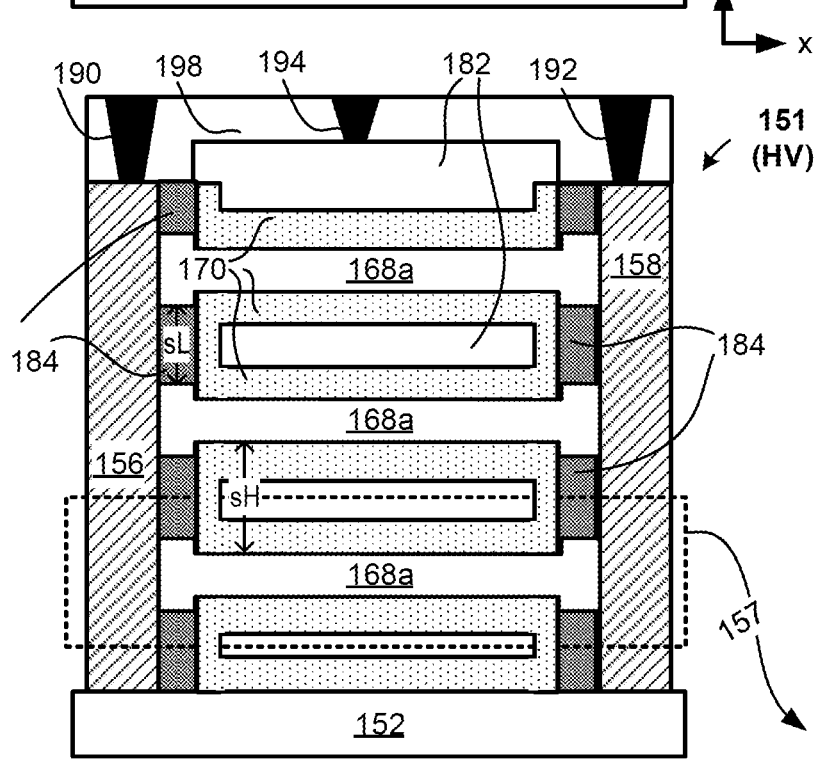
Figure 1C:
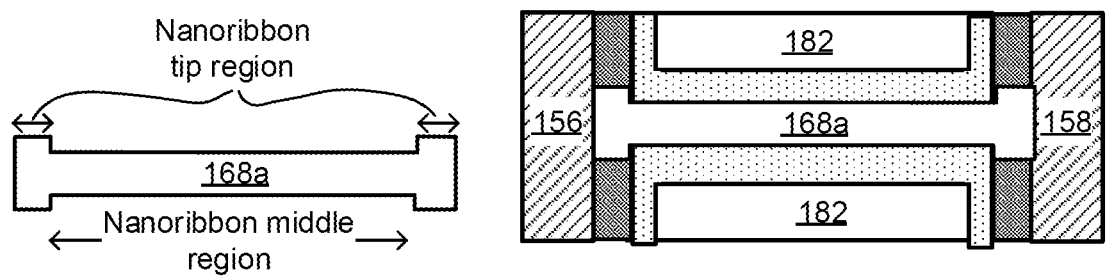

FIG. 1A illustrates perspective views of a low voltage (LV) non-planar device 101 (also referred to as LV device 101, or simply as device 101) and a high voltage (HV) non-planar device 151 (also referred to as HV device 151, or simply as device 151) of an integrated circuit 100, where a height of a channel body of the LV non-planar device 101 is more than a height of a middle section of a channel body of the HV non-planar device 151, in accordance with an embodiment of the present disclosure. FIGS. 1B, 1B1, and 1C illustrate cross-sectional views of the LV non-planar device 101 and HV non-planar device 151 of FIG. 1A, in accordance with an embodiment of the present disclosure.

The cross-sectional view of the LV device 101 of FIGS. 1B and 1B1 are along line A-A' of FIG. 1A, and the cross-sectional view of the HV device 151 of FIGS. 1B and 1B1 are along line A1-A1' of FIG. 1A. Thus, the cross-sectional views of FIGS. 1B and 1B1 are the so-called "gate-cut" views of the devices of FIG. 1A, where cross-sectional views of FIGS. 1B and 1B1 are along a section cut through the respectively gate electrodes 132, 182 of the two devices. In FIGS. 1B and 1C, no work function metal is illustrated to be wrapped around the nanoribbons of the two devices. However, FIG. 1B1 illustrates work function metal wrapped around the nanoribbons of the LV device 101 and the HV device 151.

The cross-sectional view of the LV device 101 of FIG. 1C is along line B-B' of FIG. 1A, and the cross-sectional view of the HV device 151 of FIG. 1C is along line B1-B1' of FIG. 1A. Thus, the cross-sectional views of FIG. 1C are the so-called "fin-cut" or "body-cut" views of the devices of FIG. 1A.

In one embodiment, the LV device 101 and the HV device 151 are included in a same integrated circuit (IC) chip. Thus, the integrated circuit 100 is, in an example, representative of a chip or a circuit that includes both the devices 101, 151. Although merely one LV device 101 and one HV device 151 are illustrated in FIGS. 1A-1C, the integrated circuit 100 may include a plurality of such LV devices and a plurality of such HV devices.

In an example, the LV device 101 receives and processes (i.e., is rated for) relatively low voltage signals, and the HV device 151 receives and processes (i.e., is rated for) relatively high voltage signals. Merely as an example and without limiting the scope of this disclosure, the LV device 101 receives and processes low voltages signals in a voltage range of 0-1.2 Volts (V) or 0-1.5 V, and the HV device 151 receives and processes high voltages signals that can go as high as up to 3.2 V or higher, or up to 4.0 V or higher, although other voltage ranges may also be possible. In an example, a voltage rating of the HV device 151 is at least 0.5 V, or at least 1 V, or at least 2 V more than a voltage rating of the LV device 101.

In some examples, the non-planar devices 101, 151 are GAA devices, such as GAA transistors. Although some embodiments of this disclosure have been discussed with respect to a nanoribbon transistor, the teachings of this disclosure can also be employed in other types of GAA or non-planar transistors as well, such as nanowire transistors, nanosheet transistors, or forksheet transistors, as will be appreciated in light of this disclosure.

As can be seen, the LV device 101 is formed on a substrate 102 and the HV device 151 is formed on a substrate 152. Although in the example of FIGS. 1A-1C the LV device 101 and the HV device 152 are illustrated to be formed on corresponding substrates 102 and 152, respectively, in an example, the LV device 101 and the HV device 152 can be formed on a single common substrate. Thus, in such as example, the substrates 102 and 152 are the same substrate, although the two devices 101, 152 may be formed in different sections of such as a common substrate.

Any number of semiconductor devices can be formed on each of the substrates 102, 152, although only a single device is illustrated as an example. In an example, the substrates 102 and/or 152 can be, for example, a bulk substrate including group IV semiconductor material (such as silicon, germanium, or silicon germanium), group III-V semiconductor material (such as gallium arsenide, indium gallium arsenide, or indium phosphide), and/or any other suitable material upon which transistors can be formed. Alternatively, any of the substrates can be a semiconductor-on-insulator substrate having a desired semiconductor layer over a buried insulator layer (e.g., silicon over silicon dioxide). Alternatively, individual one of the substrates 102 and/or 152 can be a multilayer substrate or superlattice suitable for forming nanowires or nanoribbons (e.g., alternating layers of silicon and SiGe, or alternating layers indium gallium arsenide and indium phosphide). Any number of substrates can be used.

The semiconductor material in the devices 101, 151 may be formed from the corresponding substrates 102, 152, respectively. For example, the devices 101, 151 may include semiconductor material, such as nanoribbons or nanowires 118, 168, respectively, that can be, for example, native to the corresponding substrate (formed from the substrate itself). Alternatively, the semiconductor material can be formed of material deposited onto an underlying substrate. In one such example case, a blanket layer of silicon germanium (SiGe) can be deposited onto a silicon substrate, and then patterned and etched to form a plurality of SiGe fins or nanoribbons. In another such example, non-native fins can be formed in a so-called aspect ratio trapping based process, where native fins are etched away so as to leave fin-shaped trenches which can then be filled with an alternative semiconductor material (e.g., group IV or III-V material). In still other embodiments, the fins include alternating layers of material (e.g., alternating layers of silicon and SiGe) that facilitates forming of nanowires and nanoribbons during a gate forming process where one type of the alternating layers are selectively etched away so as to liberate the other type of alternating layers within the channel region, so that a gate-all-around (GAA) process can then be carried out.

The LV device 101 includes a subfin region 110 and the HV device 151 includes a subfin region 160, above which the corresponding nanoribbons of the corresponding devices are vertically stacked. According to some embodiments, subfin regions 110, 160 comprise the same semiconductor material as substrates 102, 152, respectively. As illustrated, the device 101 may be separated from any adjacent device (not illustrated) by a dielectric fill 109, and the device 151 may be separated from any adjacent device (not illustrated) by a dielectric fill 159. Dielectric fills 109, 159 provide shallow trench isolation (STI) between any adjacent semiconductor devices. Dielectric fills 109, 159 can be any suitable dielectric material, such as silicon dioxide, aluminum oxide, or silicon oxycarbonitride.

The LV device 101 includes a nanoribbon channel region laterally extending between and connecting source region 106 and drain region 108, where the channel region includes two or more nanoribbons 118 (e.g., nanoribbons 118a, 118b, 118c) that extend horizontally and are arranged in a vertical stack. Similarly, the HV device 151 includes a nanoribbon channel region laterally extending between and connecting source region 156 and drain region 158, where the channel region includes two or more nanoribbons 168 (e.g., nanoribbons 168a, 168b, 168c) that extend horizontally and are arranged in a vertical stack.

According to some embodiments, the source regions 106, 156 and drain regions 108, 158 are epitaxial regions that are provided using an etch-and-replace process. In other embodiments one or both of the source and drain regions could be, for example, implantation-doped native portions of the semiconductor fins or substrate. Any semiconductor materials suitable for source and drain regions can be used (e.g., group IV and group III-V semiconductor materials). The source and drain regions may include multiple layers such as liners and capping layers to improve contact resistance. In any such cases, the composition and doping of the source and drain regions may be the same or different, depending on the polarity of the transistors. Any semiconductor materials suitable for source and drain regions can be used (e.g., group IV and group III-V semiconductor materials). In an example, the source and drain regions may be appropriately doped, based on a type of device (e.g., PMOS or NMOS).

Although not illustrated in FIGS. 1A and 1B for purposes of illustrative simplicity and illustrated in FIG. 1C, in some embodiments, conductive contacts are formed over source and drain regions and gate electrode of the two devices. For example, FIG. 1C illustrates, for the LV device 101, conductive source contact 140 extending through an Interlayer Dielectric Layer (ILD) 148 and contacting the source region 106, conductive drain contact 142 extending through the ILD 148 and contacting the drain region 108, and conductive gate contact 144 extending through the ILD 148 and contacting gate electrode 132. Similarly, for the HV device 151, conductive source contact 190 extends through an ILD 198 and contacts the source region 156, conductive drain contact 192 extends through the ILD 198 and contacts the drain region 158, and conductive gate contact 194 extends through the ILD 198 and contacts gate electrode 182. The conductive contacts may be any suitably conductive material. In some embodiments, conductive contacts include one or more of the same metal materials as gate electrode, or a different conductive material.

In the example of FIGS. 1A-1C, the LV device 101 includes corresponding nanoribbons 118a, 118b, 118c, generally referred to as nanoribbons 118. In the example of FIGS. 1A-1C, the HV device 151 includes corresponding nanoribbons 168a, 168b, 168c, generally referred to as nanoribbons 168. Although each of the devices 101, 151 is illustrated to include corresponding three nanoribbons, the channel region of individual device can have any different number of nanoribbons, such as one, two, four, or higher. Although in FIGS. 1A-1C the nanoribbons extend horizontally and are stacked vertically in each device, the present disclosure contemplates nanoribbons in a variety of configurations that include planar nanoribbon transistors, nanoribbons that extend vertically and are stacked horizontally, and other arrangements, as will be appreciated. In an example, the nanoribbon 118, 168 comprise an appropriately doped semiconductor material, such as appropriately doped silicon.

In the LV device 101, a gate structure contacts and at least in part surrounds each nanoribbon 118 between the source and drain regions 106, 108, where the gate structure includes gate dielectric 120, a gate electrode 132, and gate spacers 134. Similarly, in the HV device 151, a gate structure contacts and at least in part surrounds each nanoribbon 168 between the source and drain regions 156, 158, where the gate structure includes gate dielectric 170, a gate electrode 182, and gate spacers 184.

Note that the gate dielectric 120, 170 are not illustrated in FIG. 1A, in order to show the geometry of the nanoribbon 118, 168. Furthermore, the gate electrodes 132, 182 and the gate spacers 134, 184 are illustrated to be transparent in FIG. 1A, in order to show the geometry of the nanoribbon 118, 168 extending through the gate electrodes and gate spacers.

Bottom portion of FIG. 1C illustrates a zoomed-in view of a section 157 of the HV device 151, and also illustrates a single nanoribbon 168a. As seen, the nanoribbon 168a (and other nanoribbons as well of the devices 101, 151) comprise a middle region between tip regions. The tip regions of individual nanoribbons are in contact with the source/drain regions and are wrapped around by the respective gate spacers 134 or 184. The middle region of individual nanoribbons is wrapped around by respective dielectric layers 120 or 170.

As will be discussed herein in further detail and as illustrated in FIG. 1C, the tip region of individual nanoribbons 168 of the HV device 151 has a height hL that is greater than a height hH of the middle region of individual nanoribbons 168 of the HV device 151. In contrast, the tip regions and the middle region of individual nanoribbons 118 of the LV device 101 has the same height of hL, which matches the height of the tip regions of the nanoribbons 168 of the HV device 151.

As illustrated in the cross-section views of FIGS. 1B and 1C, in the LV device 101, the gate dielectric 120 wraps around each nanoribbon 118. Similarly, in the HV device 151, the gate dielectric 170 wraps around each nanoribbon 168. For example, the gate dielectric wraps around the middle region of individual nanoribbons, as illustrated in FIG. 1C. The gate dielectric may include a single material layer or multiple stacked material layers. In some embodiments, gate dielectric includes a first dielectric layer such as silicon oxide, and a second dielectric layer that includes a high-K material such as hafnium oxide. The hafnium oxide may be doped with an element to affect the threshold voltage of the given semiconductor device. According to some embodiments, the doping element used in gate dielectric is lanthanum. Although not illustrated, gate dielectric is present around each nanoribbon and may also be present over subfin portions 110 and/or 160. In some embodiments and although not illustrated, gate dielectric is also present over a top surface of dielectric fill 109 and/or 159.

According to some embodiments, in the LV device 101, a gate electrode 132 extends over and wraps around the nanoribbon 118. Similarly, in the HV device 151, a gate electrode 182 extends over and wraps around the nanoribbon 168. Gate electrodes 132, 182 may include any sufficiently conductive material such as a metal, metal alloy, or doped polysilicon.

In some embodiments and although not illustrated in FIGS. 1A, 1B, and 1C, one or more work function metals may be included around the individual nanoribbons of the LV device 101 and/or the HV device 151. For example, FIG. 1B1 illustrate work function metal 121 around individual nanoribbons 118 of the LV device 101, and work function metal 171 around individual nanoribbons 118 of the HV device 151.

As seen in FIG. 1C (and also in FIG. 1A), in the LV device 101, the gate structure also includes gate spacers 134 that extend along the sides of the gate electrode 132, to isolate the gate electrode 132 from the source and drain regions 106, 108. For example, a first gate spacer isolates the gate electrode 132 from the source region 106, and a second gate spacer isolates the gate electrode 132 from the drain region 108. Similarly, in the HV device 151, the gate structure also includes gate spacers 184 that extend along the sides of the gate electrode 182, to isolate the gate electrode 182 from the source and drain regions 156, 158. The gate spacers surround the tip regions of individual nanoribbon. For example, a first gate spacer surrounds first tip region of individual nanoribbon that are in contact with the source region, and a second gate spacer surrounds second tip regions of individual nanoribbons that are in contact with the drain region.

Referring now to FIG. 1B, illustrated are example dimensions of the nanoribbons of the LV device 101 and the HV device 151. Note that the cross-sectional views of FIGS. 1B and 1B1 illustrate only the middle regions of the nanoribbons 118, 168, and hence, the dimensions illustrated in FIGS. 1B, 1B1 are for the middle regions of the nanoribbons 118, 168 (i.e., not for the tip regions of the nanoribbons). FIG. 1C illustrates dimensions of the tip regions of the nanoribbons.

Referring now to FIG. 1B, "wL" refers to width of dielectric layer 120 around nanoribbons 118 of the LV device 101; "hL" refers to height of nanoribbons 118 of the LV device 101; "sL" refers to vertical spacing between adjacent nanoribbons 118 (i.e., inter-nanoribbon vertical spacing) of the LV device 101. Note that the nanoribbons 118 of the LV device 101 have the same height in the tip regions and the middle region, as seen in FIG. 1C. Accordingly, hL refers to height of both tip and middle regions of the nanoribbons 118 of the LV device 101, and sL refers to inter-nanoribbon vertical spacing between adjacent nanoribbons 118 of the LV device 101 in both tip and middle regions.

Similarly, "wH" refers to width of dielectric layer 170 around nanoribbons 168 of the HV device 151; "hH" refers to height of middle region of nanoribbons 168 of the HV device 151; and "sH" refers to vertical spacing between adjacent middle regions of nanoribbons 168 of the HV device 151.

Note that the height of a nanoribbon and spacing between two nanoribbons are measured in a vertical direction that is perpendicular to a length of the nanoribbons, as seen in FIG. 1C.

Note that FIG. 1B does not illustrate any work function metal around the nanoribbons. However, FIG. 1B1 illustrate work function metal 121 around individual nanoribbons 118 of the LV device 101, and work function metal 171 around individual nanoribbons 118 of the HV device 151. Here, wL is the width of (dielectric layer 120+work function metal 121) around nanoribbons 118 of LV device 101; and wH is the width of (dielectric layer 170+work function metal 171) around nanoribbons 168 of HV device 151. Thus, if work function metal is present in the devices 101 and/or 151, wL and wH respectively refer to the width of (dielectric layer+ work function metal) of the LV and HV devices, as seen in FIG. 1B1. If work function metal is absent, wL and wH respectively refer to the width of dielectric layer of the LV and HV devices, as seen in FIG. 1B.

In an example, the nanoribbons 168 of the HV device 151 carries higher voltage signals relative to the nanoribbons 118 of the LV device 101. Accordingly, in one embodiment, the dielectric layer 170 of the HV device 151 has to have a thickness or width that is more than that of the dielectric layer 120 of the LV device 101. Thus, the width wH of the HV device 151 is greater than the width wL of the LV device 101, i.e., wH>wL. A percentage or an amount by which wH is greater than wL may be based on several factors, such as the voltages of signals of the devices 101 and 151, type of dielectric material used in the two devices, and so on. FIGS. 1B and 1C illustrate the width wH of dielectric layer 170 around nanoribbons 168 of the HV device 151 being more than the width wL of dielectric layer 120 around nanoribbons 118 of the LV device 101. As discussed, FIGS. 1B and 1C do not illustrate the work function metal, which is illustrated in FIG. 1B1. Note that the widths wH and wL may include width of respective dielectric layer and width of respective work function metal, as discussed.

In one embodiment, a maximum width of the dielectric layer (and work function metal, if present) around the nanoribbons of a device is constrained by vertical spacing between middle regions of adjacent nanoribbons. In an example, the vertical spacing sL between middle regions of adjacent nanoribbons 118 of the LV device 101 is almost same, or less than twice the width wH of dielectric layer 170 around nanoribbons 168 of the HV device 151. That is, sL≈2·wH, or sL<2·wH.

Thus, if the nanoribbon vertical spacing sH between middle regions of adjacent nanoribbons 168 of the HV device 151 is made about the same as the nanoribbon vertical spacing sL between middle regions of adjacent nanoribbons 118 of the LV device 101, then dielectric layers 170 of adjacent nanoribbons 168 may come in contact and overlap. For example, FIG. 1D illustrates a scenario where nanoribbon height and vertical spacing between middle regions of adjacent nanoribbons in a HV device 151-1 are same as those of the LV device 101 of FIGS. 1A, 1B, and 1C, in accordance with an embodiment of the present disclosure. Thus, in this example, because (sH=sL≈2·wH) or (sH=sL<2·wH), the dielectric layers 170 of adjacent nanoribbon 168 overlap or come in contact. Thus, there is no space for gate electrode 182 between the nanoribbons 168, thereby weakening the gate control over the nanoribbons 168. Additionally, the dielectric layer 170 between the nanoribbons do not contribute to anything, e.g., due to absence of a gate electrode between the nanoribbons.

Accordingly, it may be desirable to increase the vertical spacing between middle regions of the nanoribbon 168 in the HV device 151, such that the vertical spacing sH between middle regions of adjacent nanoribbons 168 of the HV device 151 is greater than twice the width wH of the dielectric layer 170. In such a case, there would be enough space for the gate electrode 182 to be present between adjacent nanoribbons 168.

As the total height of the channel region in both the LV and HV devices are the same and fixed, the vertical spacing between middle regions of the nanoribbon 168 in the HV device 151 is increased by, for example, decreasing a height of middle regions of the nanoribbons 168 of the HV device 151. Thus, the nanoribbons 168 of the HV device 151 are "thinned" at least in the middle regions, e.g., such that the height hH of middle regions of individual nanoribbons 168 of the HV device 151 is less than the height hL of individual nanoribbons 118 of the LV device 101. That is, hH<hL.

Note that during the thinning process to decrease the height of the middle regions of the nanoribbons 168, the tip regions of the nanoribbons 168 may not be correspondingly thinned. This results in the tip regions of the nanoribbons 168 having a greater height than the middle regions, as illustrated in FIG. 1C. For example, the tip region of individual nanoribbons 168 of the HV device 151 has a height hL that is greater than the height hH of the middle region of individual nanoribbons 168 of the HV device 151. In contrast, the tip regions and the middle region of individual nanoribbons 118 of the LV device 101 has the same height of hL (e.g., as the nanoribbons 118 of the LV device are not thinned), which matches (e.g., within 5%) the height of the tip regions of the nanoribbons 168 of the HV device 151.

Thus, as seen in FIG. 1C, each nanoribbon 168 has approximately an "H" shape, with the horizontal bar of the "H" being the middle region of the nanoribbon that is wrapped by the dielectric layer 170 and gate electrode 182, and the vertical bars of the "H" being the tip regions that are wrapped by the gate spacers 184.

Note that as discussed, the tip regions and the middle region of individual nanoribbons 118 of the LV device 101 has the same height hL as that of the tip regions of the nanoribbons 168 of the HV device 151. Accordingly, inter-nanoribbon vertical spacing in the tip regions of the nanoribbons 168 is also sL, i.e., same as the inter-nanoribbon vertical spacing of the nanoribbons 118 of the LV device 101, as illustrated in FIG. 1C.

In an example, the height hH is in the range of 4-6 nanometers (nm), 4-8 nm, or 4-10 nm, whereas the height hL is in the range of 5-8, or 5-10 nm. Note that these height ranges are mere examples and implementation specific. In an example, the height hH is at least 5%, 10%, 15%, or 20% less than the height hL. In an example, a minimum height hH of the nanoribbons 168 is to be maintained, because too thin nanoribbons 168 can result in degraded channel quality and insufficient volume of the nanoribbons 168 to effectively conduct the carriers and transistor current. For example, the minimum thickness can be 4 nm or 3 nm in an example, although such a minimum thickness is merely an example and can be implementation specific.

Because of the thinning of the nanoribbons 168 of the HV device 151, the vertical spacing sH between middle regions of adjacent nanoribbons 168 in the HV device 151 increases. Thus, in the example of FIG. 1B (and contrary to the example of FIG. 1B1), the vertical spacing sH of middle regions of the nanoribbons 168 is sufficiently increased by correspondingly thinning the middle regions of the nanoribbons 168, such that sH>2·wH. Because of the thinning of the nanoribbons 168 of the HV device 151, now there is enough space between middle regions of two adjacent nanoribbons 168 to fit the dielectric layers 170 of the two nanoribbons (and work function metal, if any, see FIG. 1B1), still leaving enough space for the gate electrode 182 to be also present between two adjacent nanoribbons 168.

Thus, as illustrated in FIGS. 1A, 1B, 1B1, and 1C, individual nanoribbons 168 of the HV device 151 has relatively less middle-region height compared to individual nanoribbons 118 of the LV device 101. This results in greater vertical spacing between middle regions of adjacent nanoribbons 168 in the HV device 151, compared to the vertical spacing between adjacent nanoribbons 118 in the LV device 101. Accordingly, the HV device 151 can have dielectric layer 170 having higher thickness, compared to a thickness of the dielectric layer 120 of the LV device 101.

Figure 2A:
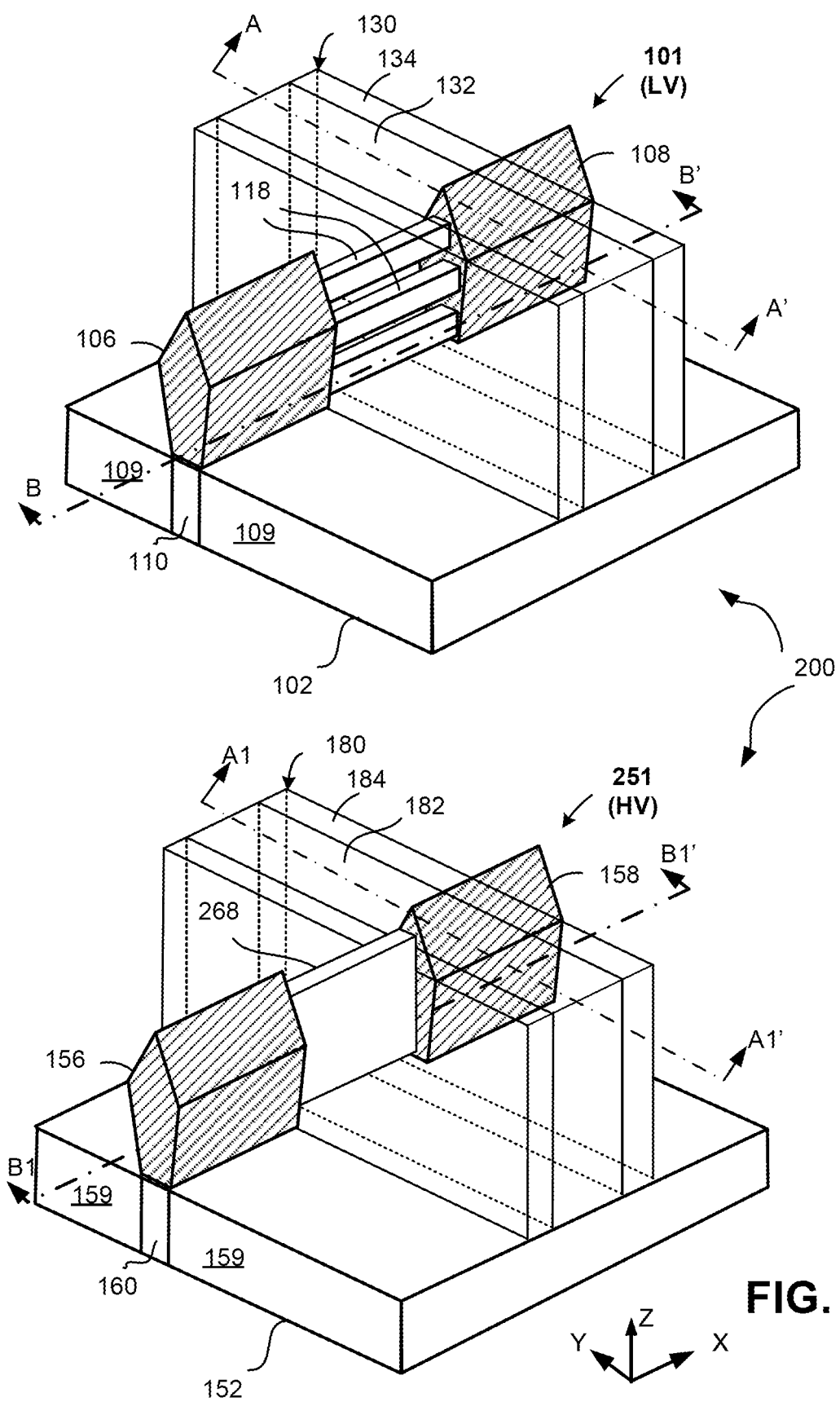

FIG. 2A illustrates perspective views of a LV non-planar device 101 and a HV non-planar device 251 of an integrated circuit 200, where a height of channel body of the LV non-planar device 101 is less than a height of channel body of the HV non-planar device 251, in accordance with an embodiment of the present disclosure. FIG. 2B1 illustrates gate-cut cross-sectional views of the LV non-planar device 101 and HV non-planar device 251 of FIG. 2A, in accordance with an embodiment of the present disclosure. FIG. 2C1 illustrates body-cut cross-sectional view of the HV non-planar device 251 of FIG. 2A, in accordance with an embodiment of the present disclosure. FIGS. 2B2 and 2C2 illustrate cross-sectional views of an alternate implementation of the HV non-planar device 251 of FIG. 2A, in accordance with an embodiment of the present disclosure.

The cross-sectional view of the LV device 101 of FIGS. 2B1 and 2B2 are along line A-A' of FIG. 2A, and the cross-sectional view of the HV device 251 of FIGS. 2B1 and 2B2 are along line A1-A1' of FIG. 2A. Thus, FIGS. 2B1 and 2B2 have similar gate-cut cross-sectional view as that of FIG. 1B.

The cross-sectional views of FIGS. 2C1 and 2C2 are along line B1-B1' of FIG. 2A, e.g., similar to the body-cut cross-sectional view of FIG. 1C.

The LV device 101 in the integrated circuit 100 of FIGS. 1A-1C is same as the LV device 101 of the integrated circuit 200 of FIGS. 2A-2C2. Accordingly, the LV device 101 of the integrated circuit 200 of FIGS. 2A-2C2 is not discussed in further detail herein. Furthermore, for similar reasons, the LV device 101 of the integrated circuit 200 of FIG. 2A is not separately illustrated in FIGS. 2C1 and 2C2.

Various components of the HV device 251 of the integrated circuit 200 are at least in part similar to the corresponding components of the HV device 151 of the integrated circuit 100, and hence, these components of the two devices are labelled using similar labels. For example, similar to the HV device 151 of the integrated circuit 100, the HV device 251 of the integrated circuit 200 comprises source region 156, drain region 158, gate stack including gate spacers 184, gate electrode 182, and gate dielectric 170.

However, unlike the HV device 151 of the integrated circuit 100 that includes two or more nanoribbons 168, the HV device 251 of the integrated circuit 200 comprises a single nanoribbon 268. For example, during formation of the HV device 251, initially the HV device 251 comprise multiple nanoribbons 668 (see FIG. 6A). Subsequently, as discussed with respect to FIGS. 6A and 6B, the nanoribbons 668 are thickened (e.g., via deposition), such that the multiple nanoribbons 668 merge to form the single nanoribbon 268 of the HV device 251 of the integrated circuit 200, as illustrated in FIGS. 2A, 2B1, 2B2, 2C1, and 2C2.

Because there is now a single nanoribbon 268 in the HV device 251, the problems associated with insufficient spacing between adjacent nanoribbons (e.g., discussed with respect to FIG. 1D) is eliminated. The single nanoribbon 268 is at least in part wrapped with dielectric layer 170 having a width or thickness of wH, as illustrated in FIGS. 2B1 and 2B2. Note that the width wH is inclusive of width of a work function metal, if present around the dielectric layer 170.

Note that in the example of FIGS. 2B1 and 2C1, the single nanoribbon 268 of the HV device 251 is fully wrapped by the dielectric layer 170. Thus, the nanoribbon 268 is separated from the substrate by the dielectric layer 170 and the gate electrode 182, as illustrated in FIGS. 2B1 and 2C1.

In contrast, in the example of FIGS. 2B2 and 2C2, during thickening of the nanoribbons 668, the resultant nanoribbon 268 reaches the substrate 152. Accordingly, in the example of FIGS. 2B2 and 2C2, the dielectric layer 170 and/or the gate electrode 182 is absent between the nanoribbon 268 and the substrate 152. Thus, the dielectric layer 170 is present on three, but not on all four sides of the nanoribbon 268 in such an example. Accordingly, in the example of FIGS. 2B2 and 2C2, the dielectric layer 170 partially, but not fully wraps around the nanoribbon 268.

Note that as illustrated in FIGS. 2C1 and 2C2, the gate spacers protrude through a monolithic structure of the nanoribbon 268. Thus, at least sections of the spacers 184 are at least partially wrapped by the single and continuous structure of the nanoribbon 268. For example, the nanoribbon 268 is on a first sidewall, a second sidewall, and a third sidewall of at least a section of the gate spacers 184. In contrast, in the LV device 101 (e.g., see the LV device 101 of FIG. 1C), a specific nanoribbon (e.g., nanoribbon 118b) is on a single side of a specific section of the gate spacer 134. No section of the gate spacer 134 has a single nanoribbon on three sides.

Furthermore, the nanoribbon 268 comprise a plurality of tip regions 269 and a middle region 270, where each tip region 269 is in direct contact with either the source region 156 or the drain region 158, as illustrated in FIGS. 2C1, 2C2. The plurality of tip regions 269 and the middle region 270 are continuous sections of the nanoribbon 268. Two vertically adjacent tip regions 269 are separated by a section of the gate spacer 184, as illustrated in FIGS. 2C1, 2C2.

As discussed herein later with respect to FIGS. 5, 6A, 6B1, and 6B2, the single nanoribbon 268 is formed by merging two or more nanoribbons 668, through a deposition process. Accordingly, a height of a middle region of the nanoribbon 268 is at least twice a height of a middle region of the nanoribbon 668 (e.g., assuming at least two nanoribbons 668 are merged), or at least thrice a height of a middle region of the nanoribbon 668 (e.g., assuming at least three nanoribbons 668 are merged). Thus, in an example, the height of the middle region of the nanoribbon 268 is at least 200%, 225%, 250%, 300%, or 350% a height of a middle region of the nanoribbon 668.

Note that each of the tip regions 269 of the nanoribbon 268 has a same height of hL, which is same as (e.g., within 5% of) the height of the tip and middle regions of the nanoribbons 118 of the LV device 101. Similarly, the inter-nanoribbon vertical space between the tip regions of the nanoribbon 268 is sL (see FIGS. 2C1, 2C2), which is same as the inter-nanoribbon vertical space between the tip/middle regions of the nanoribbon 118.

Figure 3:
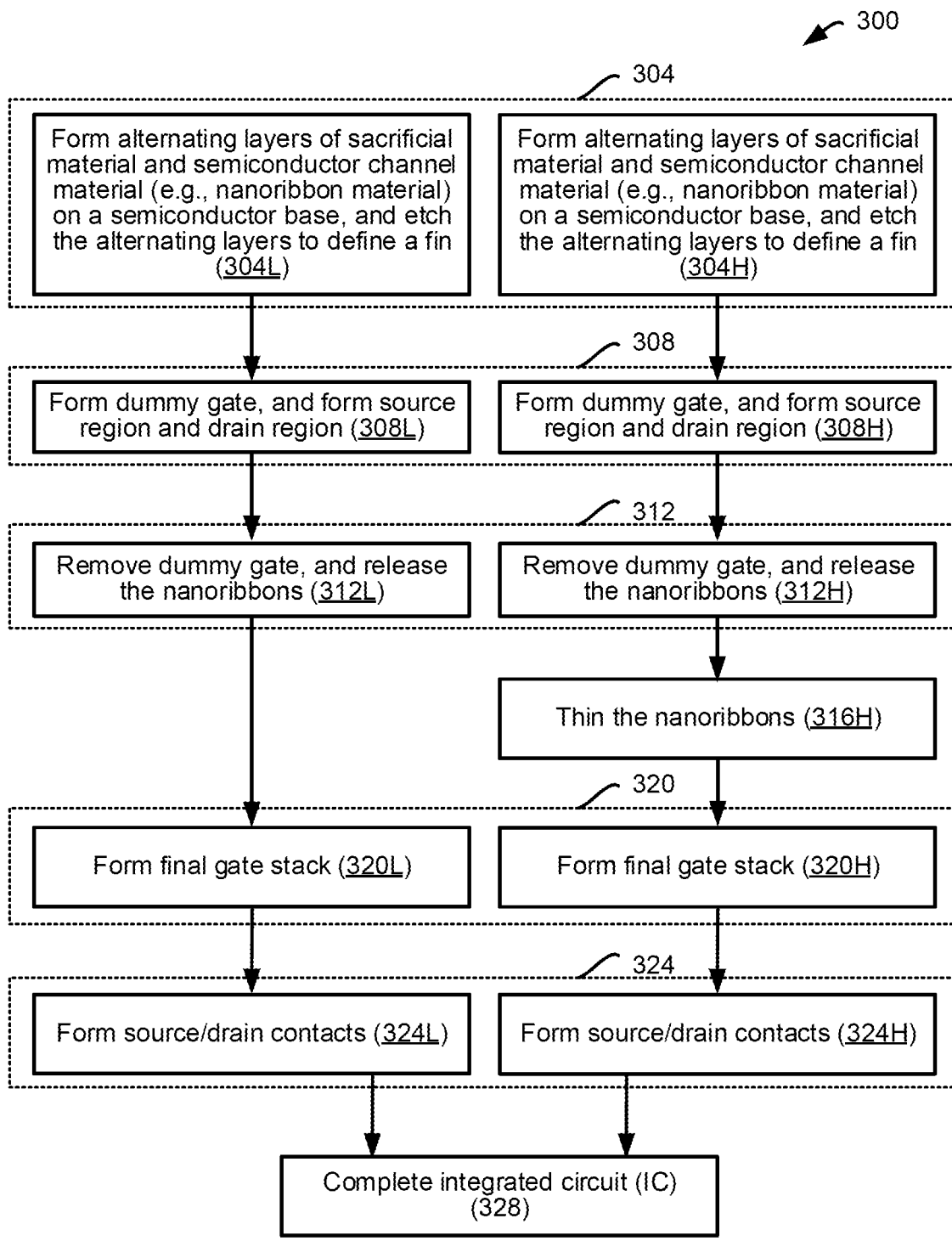
FIG. 3 illustrates a flowchart depicting a method of forming the example non-planar LV device and HV device of FIGS. 1A, 1B, 1B1, and 1C, in accordance with an embodiment of the present disclosure.

FIG. 3 illustrates a flowchart depicting a method 300 of forming the example non-planar LV device 101 and HV device 151 of FIGS. 1A, 1B, 1B1, and 1C, in accordance with an embodiment of the present disclosure. FIGS. 4A-4F illustrate cross-sectional views of example non-planar LV device and HV device (e.g., the non-planar LV device 101 and HV device 151 of FIGS. 1A-1C) in various stages of processing, in accordance with an embodiment of the present disclosure. FIGS. 3 and 4A-4F will be discussed in unison.

Figure 4A:
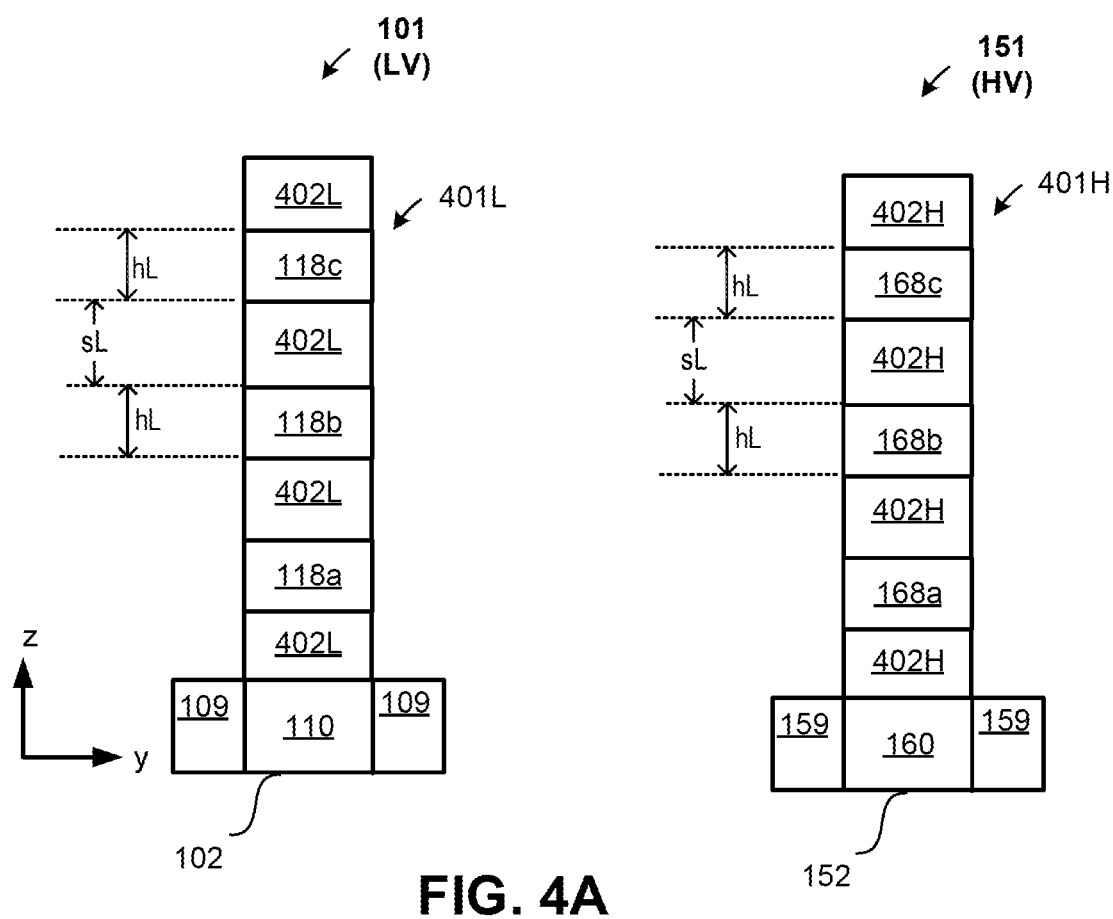
FIGS. 4A-4F illustrate cross-sectional views of an example non-planar LV device and HV device in various stages of processing, in accordance with an embodiment of the present disclosure.

Note that FIG. 4A illustrates the previously discussed gate-cut cross-sectional views of the LV and HV devices, and FIGS. 4B-4F illustrate the previously discussed body-cut cross-sectional views of the LV and HV devices.

In the method 300 of FIG. 3, the left side illustrates processes 404L, 408L, 312L and so on, to form the LV device 101. The right side illustrates processes 304H, 308H, 312H and so on, to form the HV device 151.

A process to form the LV device 101 can be co-integrated or performed at the same time as a corresponding process to form the HV device 151. Put differently, a process in the left side of FIG. 3 and a corresponding process in the right side of FIG. 3 can be performed as a part of a common process. The common process is illustrated using dotted lines. For example, a common process 304 may be performed as process 304L for the LV device 101 and as process 304H for the HV device 151.

Referring to FIG. 3, the method 300 includes, both at 304L and 304H of the process 304, forming alternating layers of sacrificial material and semiconductor channel material (e.g., nanoribbon material) on a semiconductor base, and etching the alternating layers to define a fin. For example, FIG. 4A illustrates a fin 401L formed by the process 304L for the LV device 101, and a fin 401H formed by the process 304H for the HV device 151. Fin 401L comprises a stack of alternating material layers on top of the substrate 102, and fin 401H comprises a stack of alternating material layers on top of the substrate 152.

For the fin 401L, the stack of alternating material layers includes layers of a sacrificial material 402L (e.g., SiGe) and semiconductor channel body (e.g., nanoribbon) material 118 (e.g., Si). For the fin 401H, the stack of alternating material layers includes layers of a sacrificial material 402H (e.g., SiGe) and semiconductor channel body (e.g., nanoribbon) material 168 (e.g., Si).

Note that as illustrated in FIG. 4A, each of the LV device 101 and the HV device 151 has channel body material that has a height of hL and a vertical spacing between adjacent bodies as sL, see FIGS. 1B1 and 1C for further detail of these dimensions. Thus, the LV device 101 and the HV device 151 initially have nanoribbons 118, 168, respectively, each with dimensions that of the LV device 101.

The fin 401L of FIG. 4A can result from an anisotropic etch through blanket layers of sacrificial material 402L and channel material of the nanoribbons 118 to define the fin 401L, and the fin 401H can be formed in a similar manner. Although not illustrated, in an example, the sidewalls of each of the fin may taper slightly vertically upwards, and the top layer can have a rounded profile due to the etch process, as will be appreciated.

The following discussion regarding the base applies to one or both the bases 102, 152 of the LV device 101 and the HV device 151, respectively. One or both the bases 102, 152 may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the base is bulk silicon, such as monocrystalline silicon. In other embodiments, the base can be any suitable semiconductor material, including silicon, silicon carbide (SiC), gallium nitride (GaN), and gallium arsenide (GaAs) to name a few examples. The base can be selected in some embodiments from III-V materials and group IV materials.

Further, the base can comprise a semiconductor layer deposited or grown on a substrate, such as silicon carbide layer epitaxially grown on a sapphire substrate. In still other embodiments, the base can be bulk semiconductor material, such as a wafer sliced from a boule or other bulk semiconductor material.

The base in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable starting substrate where the top layer includes Si. In some embodiments, the base may be doped with any suitable n-type and/or p-type dopant at a dopant concentration in the range of 1E16 to 1E22 atoms per cubic cm, for example. For instance, a silicon base can be p-type doped using a suitable acceptor (e.g., boron) or n-type doped using a suitable donor (e.g., phosphorous, arsenic) with a doping concentration of at least 1E16 atoms per cubic cm. However, in some embodiments, the base may be undoped/intrinsic or relatively minimally doped (such as including a dopant concentration of less than 1E16 atoms per cubic cm), for example. In some embodiments, the base is a silicon substrate consisting essentially of Si. In other embodiments, the base may primarily include Si but may also include other material (e.g., a dopant at a given concentration). Also, note that the base material may include relatively high quality or device-quality monocrystalline Si or other material that provides a suitable template or seeding surface from which other monocrystalline semiconductor material features and layers can be formed. Therefore, unless otherwise explicitly stated, a base as described herein is not intended to be limited to a base that only includes Si.

In some embodiments, the base may have a crystalline orientation described by a Miller index of (100), (110), or (111), or its equivalents, as will be apparent in light of this disclosure. Although the base in this example embodiment is shown for ease of illustration as having a thickness (dimension in the Y-axis direction) similar to that of other layers in the figures, the base may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, the base may include a multilayer structure including two or more distinct layers that may or may not be compositionally different. In some embodiments, the base may include grading (e.g., increasing and/or decreasing) of one or more material concentrations throughout at least a portion of the material. In some embodiments, the base may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

As discussed, the processes 304L, 304H includes forming alternating layers of sacrificial material and channel material on the base, for the LV and HV devices. For one or both the HV and LV devices, the sacrificial layer is formed directly on the base, followed by the channel material, and followed by additional layer pairs of sacrificial material and channel material, and finally followed by a top layer of sacrificial material. For example, the first (bottom) layer on the base is the sacrificial material and the last (top) layer is also the sacrificial material, thereby providing layers of the channel material between layers of the sacrificial material. In one example embodiment, the base is bulk silicon (Si), the sacrificial material is silicon germanium (SiGe), and the channel material is silicon doped with a suitable dopant and concentration. In another example, the base is graphene, the sacrificial material is gallium, and the channel material is gallium arsenide (GaAs). Other material combinations can also be used, as will be appreciated.

Each layer of sacrificial material or channel material can be formed using any suitable processing, such as one or more deposition or epitaxial growth processes, as will be apparent in light of this disclosure. In one embodiment, alternating layers of sacrificial material and channel material can be formed using layer-by-layer epitaxial growth, where the sacrificial material can subsequently be removed to release nanoribbons of the channel material. For instance, in an example embodiment, a given channel layer may include alternating layers of group IV and group III-V semiconductor material, where either the group IV or group III-V material is sacrificial, to enable the formation of one or more nanoribbons. In some embodiments, a given layer of channel material may include a vertical channel height (dimension in the Y-axis direction) in the range of 5 nm to 50 nm (or in a subrange of 5-45, 5-40, 5-35. 5-30. 5-25, 5-20, 5-15, 5-10, 10-40, 10-30, 10-20, 15-40, 15-30, 15-20, 20-40, 20-30 and 30-40 nm) and/or a maximum vertical thickness of at most 50, 40, 30, 25, 20, 15, or 10 nm, for example. Other suitable materials and channel height requirements or thresholds will be apparent in light of this disclosure.

In some embodiments, multiple different channel materials may be formed on different areas of the substrate, such as for CMOS applications, for example. For instance, a first channel material may be formed on a first area of the substrate to be used for one or more p-channel transistor devices (e.g., one or more PMOS devices) and a second channel material may be formed on a second area of the substrate 200 to be used for one or more n-channel transistor devices (e.g., one or more NMOS devices). By selecting the subfin material to have the desired properties, multiple different channel materials can be grown. For instance, in some such embodiments, the first channel material may include a n-type group III-V or group IV material and a second channel material may include a p-type group III-V or group IV material.

In some embodiments employing multiple different channel materials, the first channel material may include group IV semiconductor material (e.g., Si, SiGe, Ge, etc.) and the second channel material may include group III-V semiconductor material (e.g., GaAs, InGaAs, InP, etc.). In general, a given channel material may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel materials may be formed using any suitable techniques, such as masking, depositing, and removing the masking as desired to form any number of compositionally different channel materials. Numerous different channel material configurations and variations will be apparent in light of this disclosure.

As discussed, the processes 304L, 304H further includes defining the fins 401L, 401H (see FIG. 4A). For example, each fin has a subfin portion (e.g., subfin portions 110, 160, see FIG. 4A) of base material and an upper fin portion of alternating layers of sacrificial material and channel material. In embodiments where blanket layers of material are formed on the base, for example, regions to be processed into fins are masked, followed by etching the surrounding regions to define one or more fins. For instance, an anisotropic etch proceeds substantially vertically through the upper fin portion to define isolation trenches between adjacent fins. In some embodiments, the etch process proceeds into the base to define a fin that includes a subfin portion of the base material and an upper fin portion of alternating layers of sacrificial material and channel material. In some embodiments, the etch process defines groups of parallel fins extending vertically up from the base. In other embodiments, the etch defines planar or 3D transistor structures having an H shape, where the channel region corresponds to the beam extending between the source and drain regions represented by the vertical bars of the H.

In other embodiments, for example, the alternating layers of sacrificial material and channel material are formed on the base by growth or deposition in a trench. For example, the trench is an aspect ratio trapping trench ("ART" trench) defined in a layer of insulating material, such as silicon dioxide ($SiO_2$) formed by thermal oxidation or by deposition using a suitable one of the aforementioned techniques. The insulating material is then patterned and etched to define trenches that extend to a substrate or other material layer. A base material can be formed directly on the substrate in the lower portion of the trench, followed by alternating layers of the sacrificial material and channel material. The insulating material can be recessed to expose all or part of the fin. In some embodiments, the insulating material is recessed to the top of the subfin (i.e., base material) to expose only the layer stack of sacrificial material and channel material in the upper portion of the fin. In other embodiments, the insulating material is recessed completely to expose the entire subfin, or recessed to a level below the first layer of sacrificial material to expose a portion of the subfin. Numerous variations and embodiments will be apparent in light of the present disclosure.

In yet other embodiments, defining fins may be performed using a replacement fin-based approach. In one embodiment, the replacement fin-based approach includes forming fins in the base, such as by patterning and etching bulk semiconductor material. Shallow trench isolation (STI) material is the formed around those fins, followed by recessing the native-to-substrate fins to define fin-shaped trenches in the STI material. Subfin material and alternating layers of sacrificial material and channel material can then be formed in the fin-shaped trenches. In one embodiment, the replacement fin approach continues with removing the STI material and forming an insulating material on the base between the subfins, leaving the layer stack of alternating sacrificial material and channel material exposed.

In some embodiments, the subfin is a Group IV semiconductor material, such as single-crystal silicon or germanium. In other embodiments, the subfin material is a Group III-V semiconductor material, such as GaAs, InGaAs, AlGaAs, or AlAs, to name a few examples. In some embodiments, the subfin material may or may not be doped with a suitable dopant (e.g., boron, phosphorous, and/or arsenic). In embodiments where the subfin material is doped, it may be n-type doped (e.g., with phosphorous or arsenic) or p-type doped (e.g., with boron) at a dopant concentration in the range of 1E16 to 1E22 atoms per cubic cm, for example. In some embodiments, the subfins may have a multilayer structure including two or more distinct layers (that may or may not be compositionally different). In some embodiments, the subfins may include grading (e.g., increasing and/or decreasing) of one or more material concentrations throughout at least a portion of the subfin material.

In some embodiments, each fin may include a vertical fin height (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical fin height of at most 500, 450, 400, 350, 300, 250, 200, 150, 100, or 50 nm, for example. In some embodiments, each fin may include a horizontal fin width (dimension in the X-axis direction) in the range of 2-50 nm (or in a subrange of 2-5, 2-10, 5-10, 5-20, 5-30, 5-50, 10-20, 10-30, 10-50, 20-30, 20-50, or 30-50 nm) and/or a maximum horizontal fin width of at most 50, 30, 20, 10, or 5 nm, for example. In some embodiments, the ratio of fin height to fin width may be greater than 1, such as greater than 1.5, 2, 2.5, 3, 3.5, 4, 4.5, 5, 6, 7, 8, 9, 10, 15, 20, or greater than any other suitable threshold ratio, as will be apparent in light of this disclosure. Other suitable materials and thickness values/ranges/thresholds will be apparent in light of this disclosure.

In some embodiments, the base or subfin material may be oppositely type doped relative to the overlying upper fin material (e.g., of the source and drain regions) to provide a tunnel diode configuration to help reduce or eliminate parasitic leakage (e.g., subthreshold leakage). For instance, in some embodiments, the subfin material may be intentionally p-type doped (e.g., with a doping concentration of at least 1E16, 5E16, 1E17, 5E17, 1E18, 5E18, or 1E19 atoms per cubic cm) if the overlying material is to be n-type doped, or vice versa.

Referring again to FIG. 3, the method 300 then proceeds from 304L to 308L, and from 304H to 308H, where processes 308L and 308H are a part of a common process 308. Thus, for example, processes 308L and 308H may be performed at least in part in an overlapping manner and using the same process flow.

Figure 4B:
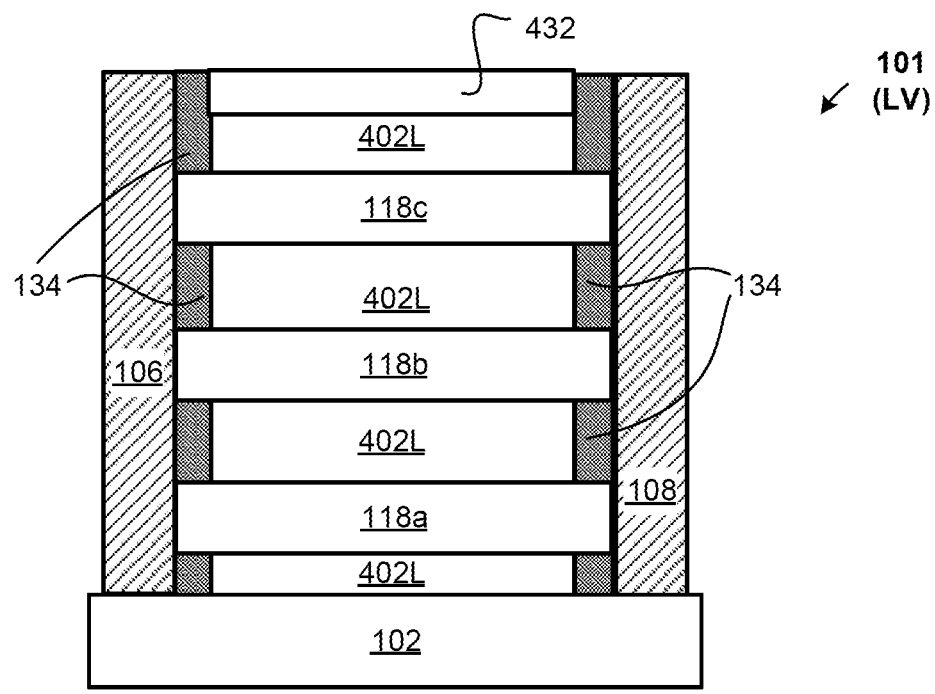
Figure 4B:
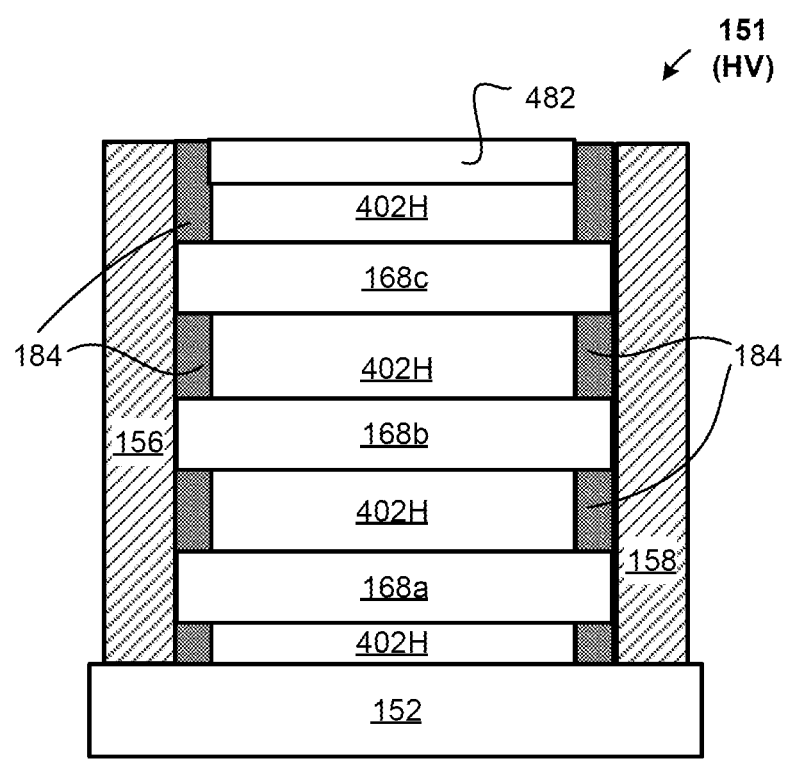

Each of the processes 308L and 308H comprises forming dummy gate on channel regions of the fins. In one embodiment, each of the processes may include deposition of a dummy gate oxide, deposition of a dummy gate electrode (e.g., poly-Si), and optionally, deposition and patterning of a hardmask. Gate spacers are formed along opposite sides of the dummy gate electrode. For example, the gate spacers comprise silicon nitride ($Si_3N_4$) or other suitable material, as will be appreciated. For example, FIG. 4B illustrates the LV device 101 with gate spacers 134 and dummy gate electrode 432. In an example, dummy gate oxide may also be formed (not illustrated in FIG. 4B). FIG. 4B also illustrates the HV device 151 with gate spacers 184 and dummy gate electrode 482. In an example, dummy gate oxide may also be formed.

Each of the processes 308L and 308H also comprises forming source and drain regions for the respective LV device 101 and HV device 151. For example, as illustrated in FIG. 4B, source region 106 and drain region 108 are formed on both sides of the gate spacers 134 in the LV device 101. Furthermore, source region 156 and drain region 158 are formed on both sides of the gate spacers 184 in the HV device 151.

In one embodiment, forming the source and drain regions can be performed by etching at least a portion of the exposed source and drain portion of the fins to remove the layer stack, and forming replacement source and drain material using any suitable techniques, such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In some embodiments, the exposed source/drain regions of the fins need not be completely removed; instead, the material in the layer stack at the source/drain regions is converted to final source/drain regions by doping, implantation, and/or cladding with a source/drain material or other suitable processing, for example.

In some embodiments, the source and drain regions may be formed one polarity at a time, such as performing processing for one of n-type and p-type regions, and then performing processing for the other of the n-type and p-type regions. In some embodiments, the source and drain regions may include any suitable doping scheme, such as including suitable n-type and/or p-type dopant (e.g., in a concentration in the range of 1E16 to 1E22 atoms per cubic cm). However, in some embodiments, at least one source or drain region may be undoped/intrinsic or relatively minimally doped, such as including a dopant concentration of less than 1E16 atoms per cubic cm, for example.

Figure 4C:
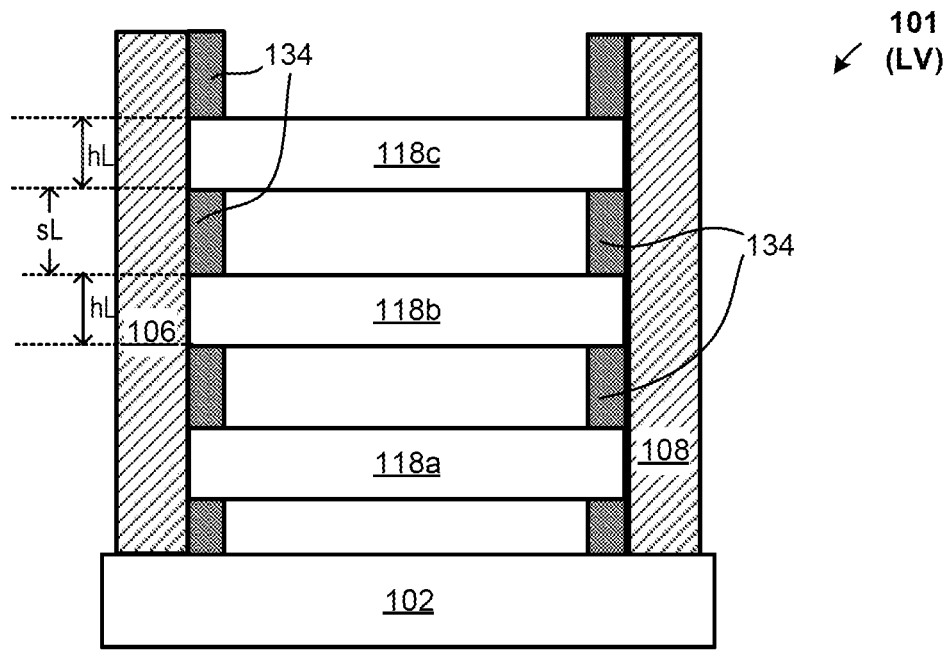
Figure 4C:
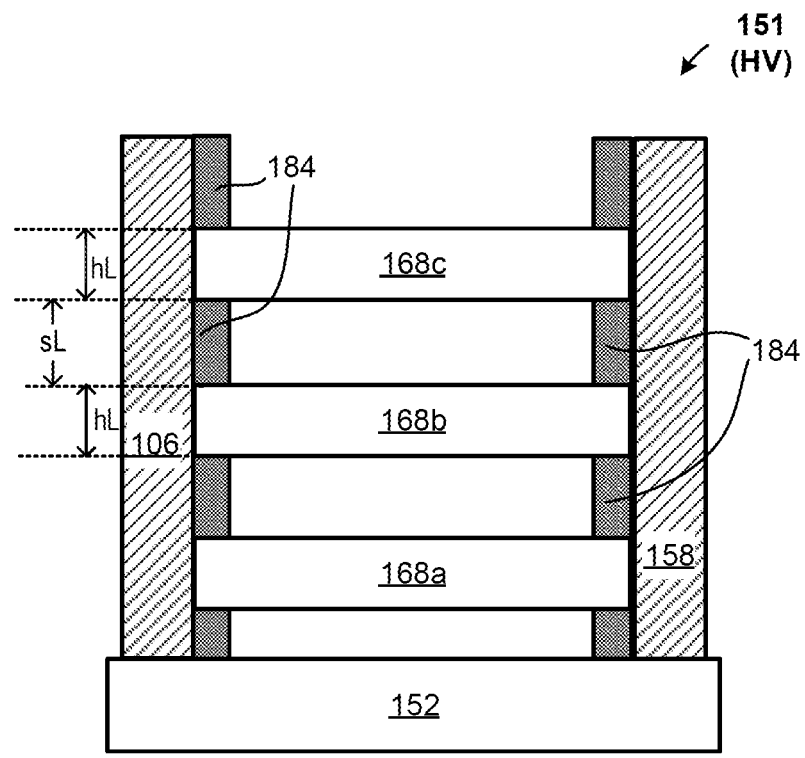

Referring again to FIG. 3, the method 300 then proceeds from 308L to 312L, and from 308H to 312H, where processes 312L and 312H are a part of a common process 312. Thus, for example, processes 312L and 312H may be performed at least in part in an overlapping manner and using the same process flow. In one embodiment, each of the processes 312L, 312H comprises removing the dummy gate, and releasing nanoribbons in the channel region. FIG. 4C illustrates the LV device 101 and the HV device 151, with nanoribbons 118 of the LV device and the nanoribbons 168 of the HV device released.

Note that, prior to releasing the nanoribbons, the dummy gate materials are removed via an etch process that is selective to the gate spacer and other non-gate materials exposed during channel and gate processing. Removing the dummy gate electrode between the gate spacers exposes the channel region of the fin. For example, a polycrystalline silicon dummy gate electrode can be removed using a wet etch process (e.g., nitric acid/hydrofluoric acid), an anisotropic dry etch, or other suitable etch process, as will be appreciated. At this stage of processing, the layer stack of alternating layers of channel material and sacrificial material is exposed in the channel region. The channel region extends between and contacts the source and drain regions, where ends of the layer stack in the are protected by the gate spacers.

The sacrificial material in the layer stack can then be removed by etch processing, to release the nanoribbons, in accordance with some embodiments. Etching the sacrificial material may be performed using any suitable wet or dry etching process such that the etch process selectively removes the sacrificial material and leaves intact the channel material. In one embodiment, the sacrificial material is silicon germanium (SiGe) and the channel material is electronic grade silicon (Si). For example, a gas-phase etch using an oxidizer and hydrofluoric acid (HF) has shown to selectively etch SiGe in SiGe/Si layer stacks. In another embodiment, a gas-phase chlorine trifluoride (ClF3) etch is used to remove the sacrificial SiGe material. The etch chemistry can be selected based on the germanium concentration, nanoribbon dimensions, and other factors, as will be appreciated. After removing the SiGe sacrificial material, the resulting channel region includes silicon nanoribbons extending between the source and drain regions of the fin, where ends of the nanoribbons (e.g., silicon) contact the source and drain structures and remain at least partially protected by the gate spacers.

Figure 4D:
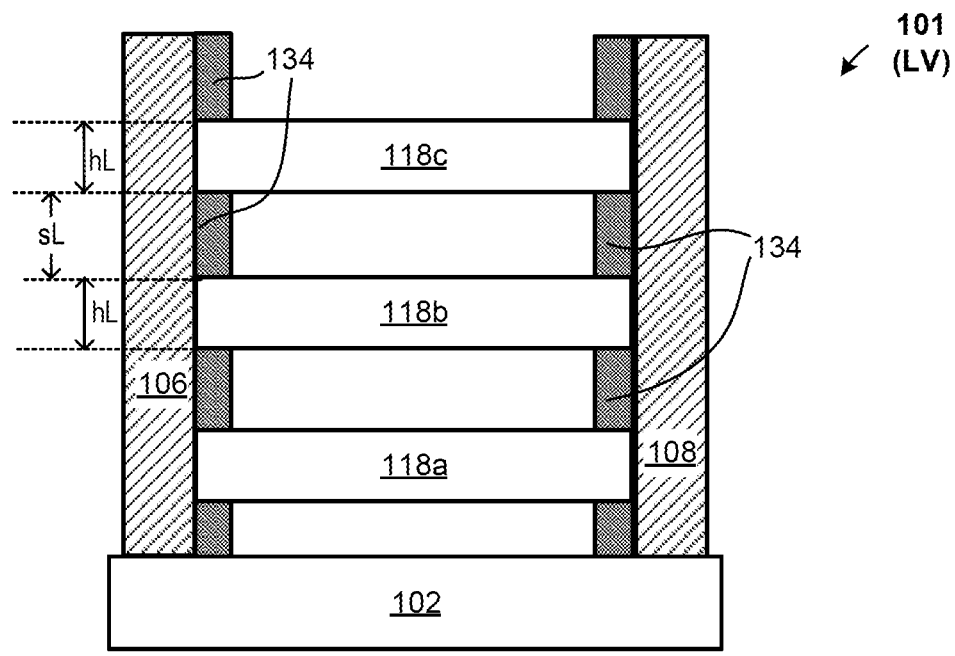
Figure 4D:
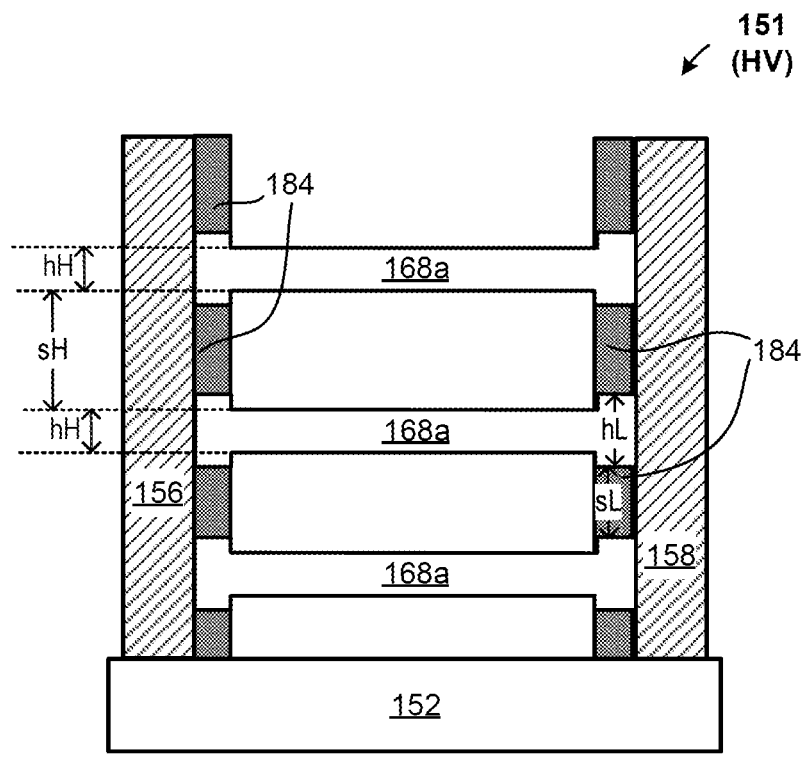

Referring again to FIG. 3, the method 300 then proceeds from 312H to 316H. As illustrated in FIG. 3, the process 316H is performed on the HV device 151, and no corresponding process is performed on the LV device 101. At 316H, the nanoribbons 168 of the HV device 151 are thinned. For example, middle regions of the nanoribbons 168 of the HV device 151 are thinned. An etching process, such as atomic layer etch (ALE), a wet etch process, an anisotropic dry etch, or other suitable etch process may be employed. The etchant may selectively etch the semiconductor material of the nanoribbons 168 (such as silicon), without affecting the gate spacers 184 (e.g., which may comprise silicon nitride). In an example, the tip regions of the nanoribbons 168 may be protected by the gate spacers 184 from being thinned or removed, although in another example, the tip regions of the nanoribbon 168 may be partially thinned. FIG. 4D illustrates the HV device 151, after the thinning of the middle regions of the nanoribbons 168.

Comparing FIGS. 4C and 4D, prior to the thinning process 316H, each of the nanoribbons 118 and 168 had height of hL and inter-nanoribbon vertical spacing of sL, as illustrated in FIG. 4C. However, after the thinning process 316H, as illustrated in FIG. 4D, the middle regions of the thinned nanoribbons 168 have height of hH and inter-nanoribbon vertical spacing of sH. As discussed, hH is less than hL due to the thinning, and accordingly, sH is greater than sL.

Note that the dimensions of the nanoribbons 118 of the LV device 101 do not change, as the thinning process is only applied to the middle regions of the HV device 151.

Furthermore, the tip regions of the nanoribbons 168 in FIG. 4D has the height of hL and inter-nanoribbon vertical spacing of sL (e.g., same as before), as the thinning process is not applied to the tip regions of the nanoribbon 168 of the HV device 151. For example, the tip regions of the nanoribbons 168 may be protected by the gate spacers 184 from being thinned or removed.

Referring again to FIG. 3, the method 300 then proceeds from 316H to 320H, and from 312L to 320L, where processes 320L and 320H are a part of a common process 320. Thus, for example, processes 320L and 320H may be performed at least in part in an overlapping manner and using the same process flow. In one embodiment, each of the processes 320L, 320H comprises forming a final gate stack in respective ones of the LV device 101 and HV device 151.

Figure 4E:
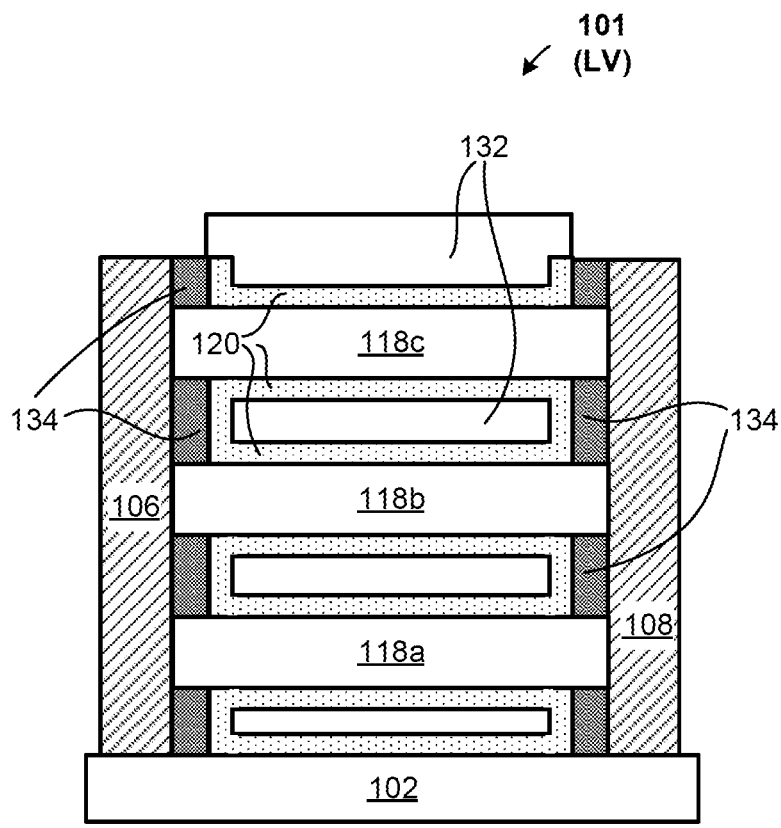
Figure 4E:
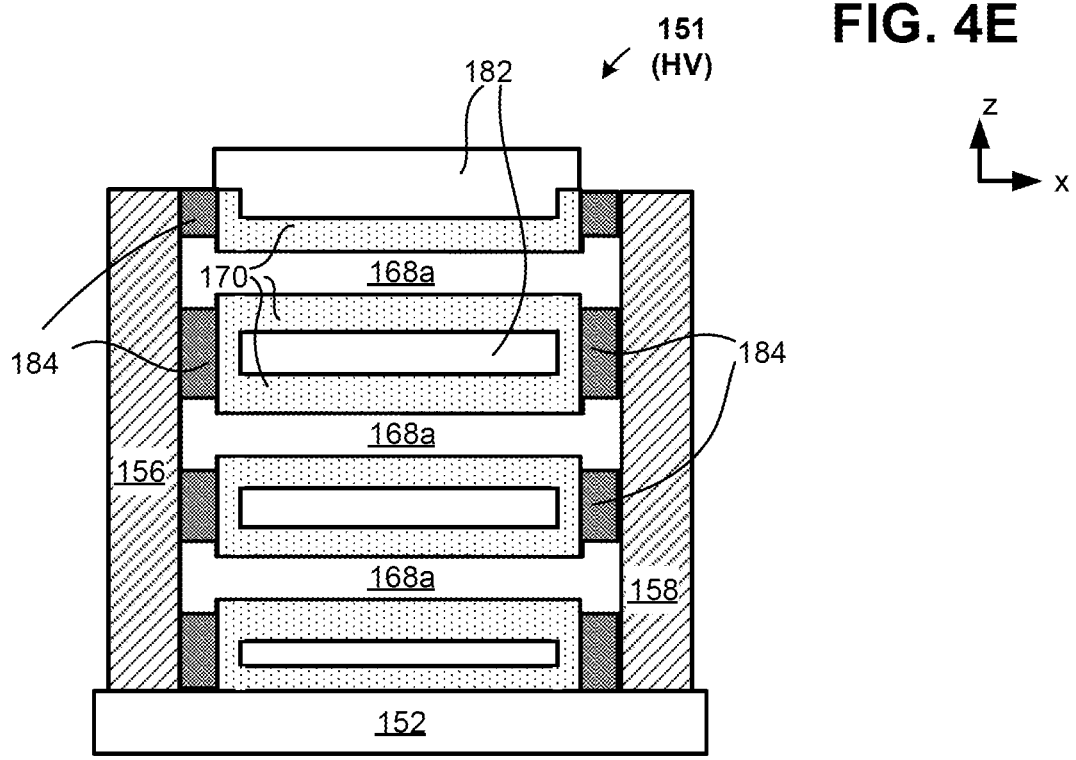

For example, FIG. 4E illustrates the LV device 101 and the HV device 151, with the corresponding gate stack formed. For example, the gate stack of the LV device 101 comprises gate dielectric 120 wrapped around middle regions of individual nanoribbons 118, and the gate electrode 132 around the gate dielectric 120. Similarly, the gate stack of the HV device 151 comprises gate dielectric 170 wrapped around middle regions of individual nanoribbons 168, and the gate electrode 182 around the gate dielectric 170.

In this example embodiment, for each of the devices 101, 151, the gate stack is formed using a gate-last fabrication flow, which may be considered a replacement gate or replacement metal gate (RMG) process. In embodiments utilizing a nanoribbon channel structure, the gate stack may substantially (or completely) surround each nanoribbon middle region portion, such as wrapping around at least 80, 85, 90, 95% or more of each nanoribbon. Processing the final gate stack includes depositing the gate dielectric 120, 170 on the exposed nanoribbon middle region in the channel region, followed by formation of the gate electrodes 132, 182 in contact with the gate dielectric. Any suitable technique can be used, including spin-coating or CVD deposition, for example. The gate dielectric may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric can be annealed to improve its quality when high-k dielectric material is used. The gate electrode may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, gate dielectric and/or gate electrode may include a multilayer structure of two or more material layers, for example. For instance, in some embodiments, a multilayer gate dielectric may be employed to provide a more gradual electric transition from the channel region to the gate electrode, for example. In some embodiments, the gate dielectric and/or gate electrode may include grading (e.g., increasing and/or decreasing) the content or concentration of one or more materials in at least a portion of the feature(s). In some embodiments, one or more additional layers may also be present in the final gate stack, such as one or more relatively high or low work function layers and/or other suitable layers. Note that the gate dielectric may also be used to form replacement gate spacers on one or both sides of the nanoribbon body, such that the gate dielectric is between the gate electrode and one or both gate spacers, for example. Numerous different gate stack configurations will be apparent in light of this disclosure.

Figure 4F:
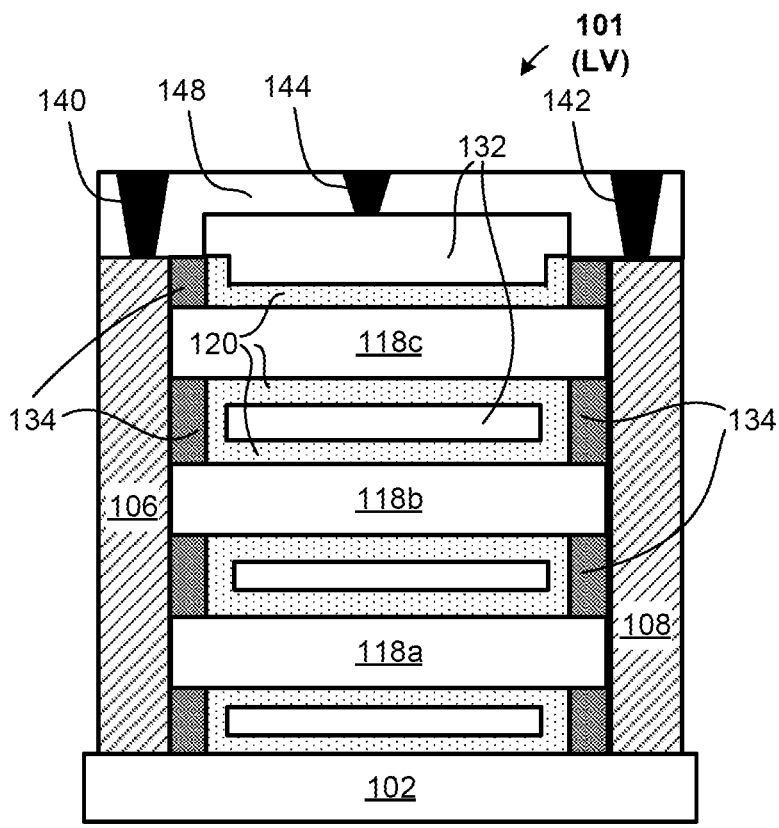
Figure 4F:
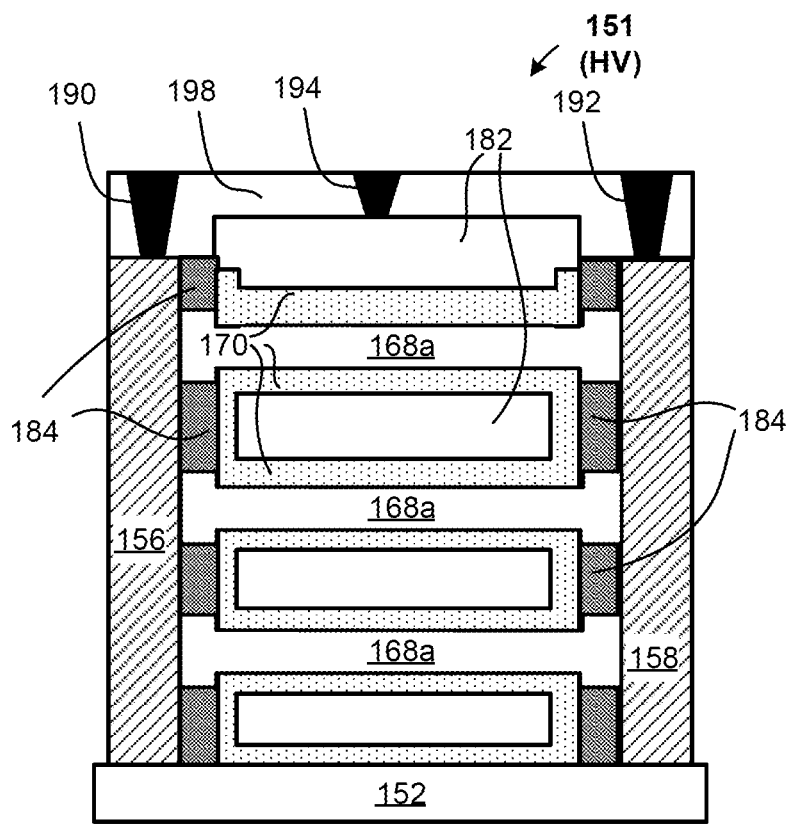

Referring again to FIG. 3, the method 300 then proceeds from 320L to 324L, and from 320H to 324H, where processes 324L and 324H are a part of a common process 324. Thus, for example, processes 324L and 324H may be performed at least in part in an overlapping manner and using the same process flow. In one embodiment, each of the processes 324L, 324H comprises forming, for LV device 101 and HV device 151, corresponding source/drain contacts. FIG. 4F illustrates the devices 101 and 151, with corresponding source/drain contacts formed. For example, FIG. 4F illustrates, for the LV device 101, conductive source contact 140 extending through an ILD 148 and contacting the source region 106, conductive drain contact 142 extending through the ILD 148 and contacting the drain region 108, and conductive gate contact 144 extending through the ILD 148 and contacting gate electrode 132. Similarly, for the HV device 151, conductive source contact 190 extends through an ILD 198 and contacts the source region 156, conductive drain contact 192 extends through the ILD 198 and contacts the drain region 158, and conductive gate contact 194 extends through the ILD 198 and contacts gate electrode 182.

In some embodiments, the source and drain contacts can be formed using any suitable techniques, such as forming contact trenches in the respective ILD layers 148, 198 over the respective source/drain regions, and then depositing metal or metal alloy (or other suitable electrically conductive material) in the trenches. In some embodiments, forming the source/drain contacts may include silicidation, germanidation, III-V-idation, and/or annealing processes, for example. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance reducing layer may be present between a given source or drain region and its corresponding source or drain contact, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region, for example.

Referring again to FIG. 3, the method 300 then proceeds from 324L and 324H to 328, where a general integrated circuit (IC) comprising the LV device 101 and the HV device 151 is completed, as desired, in accordance with some embodiments. Such additional processing to complete an IC may include back-end or back-end-of-line (BEOL) processing to form one or more metallization layers and/or to interconnect the transistor devices formed, for example. Any other suitable processing may be performed, as will be apparent in light of this disclosure.

Note that the processes in method 300 are shown in a particular order for ease of description. However, one or more of the processes may be performed in a different order or may not be performed at all (and thus be optional), in accordance with some embodiments. Numerous variations on method 300 and the techniques described herein will be apparent in light of this disclosure.

Figure 5:
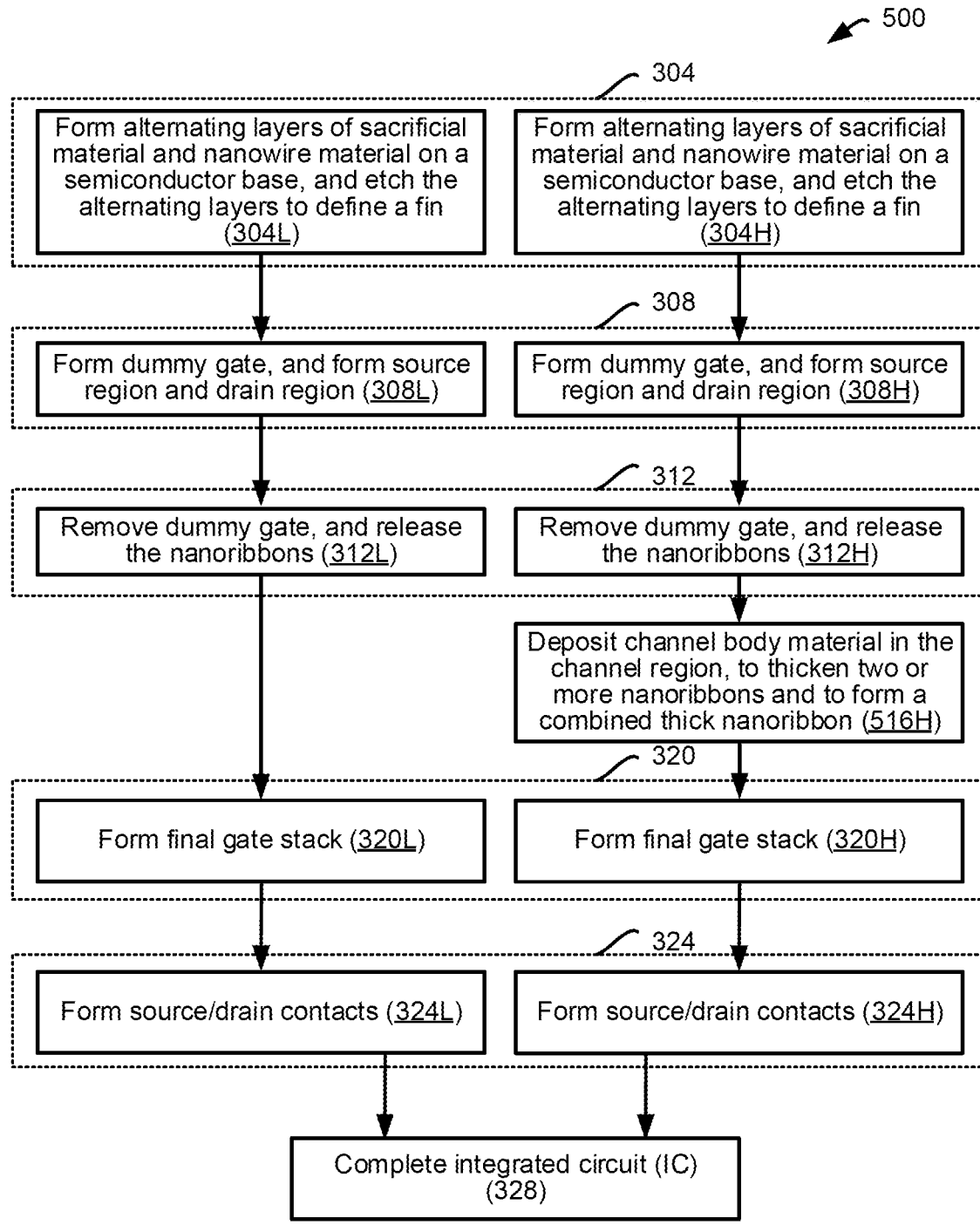
FIG. 5 illustrates a flowchart depicting a method of forming the example non-planar LV device and HV device of FIGS. 2A, 2B1, 2B2, 2C1, and 2C2, in accordance with an embodiment of the present disclosure.
Figure 6A:
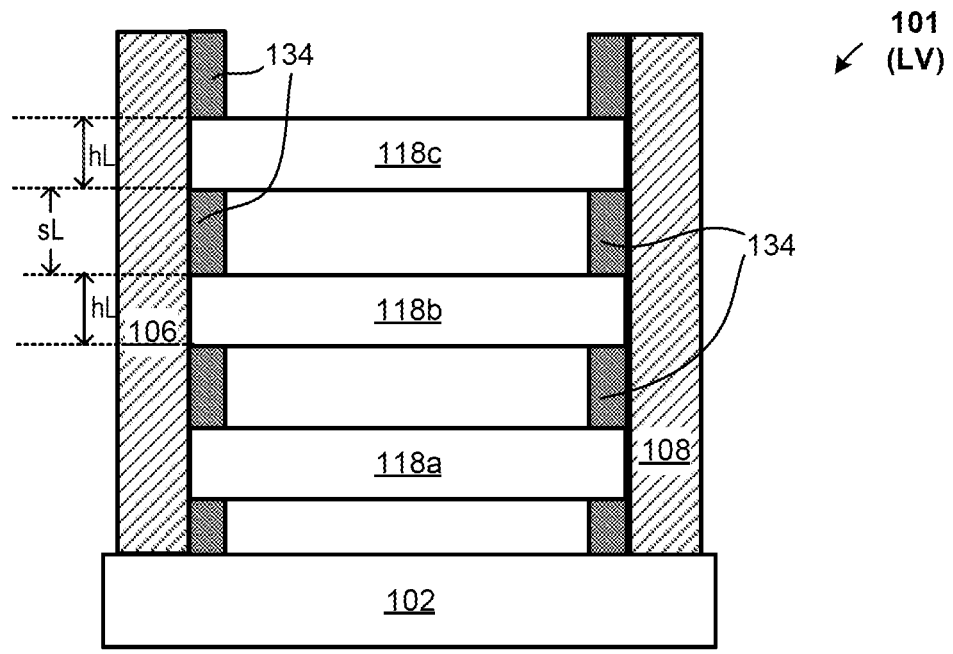
Figure 6A:
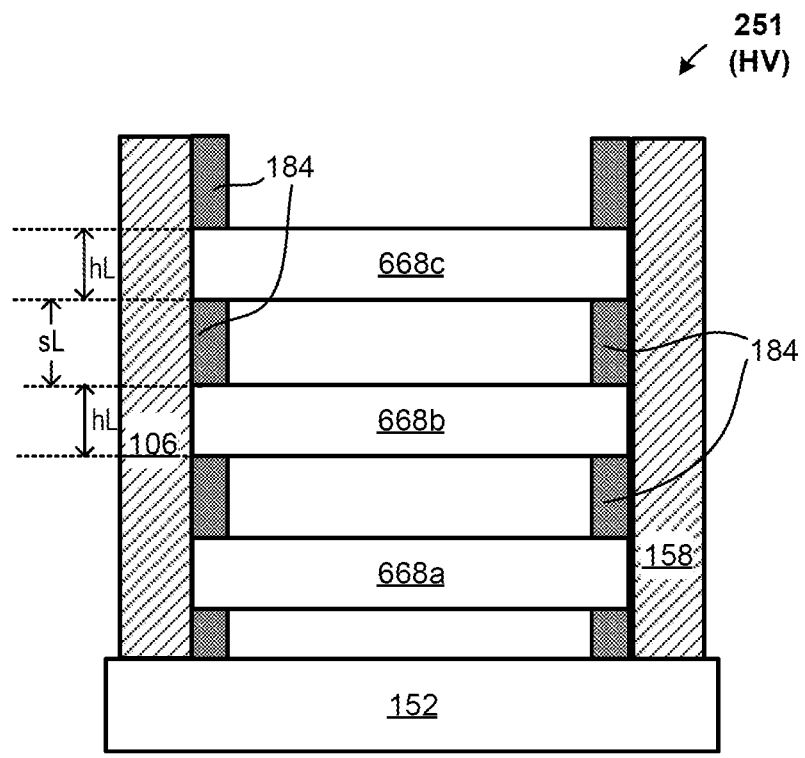

FIG. 5 illustrates a flowchart depicting a method 500 of forming the example non-planar LV device 101 and HV device 251 of FIGS. 2A, 2B1, 2B2, 2C1, and 2C2, in accordance with an embodiment of the present disclosure. FIGS. 6A, 6B1, and 6B2 illustrate cross-sectional views of example non-planar LV device and HV device (e.g., the non-planar LV device 101 and HV device 251) in various stages of processing, in accordance with an embodiment of the present disclosure. FIGS. 5 and 6B-6B2 will be discussed in unison. Note that FIGS. 6A, 6B1, and 6B2 illustrate the previously discussed body-cut cross-sectional views of the LV and HV devices.

The method 500 of FIG. 5 and the method 300 of FIG. 3 have several similar processes, and these similar processes in the two figures are labelled similarly. A difference between these two methods is that the method 300 includes process 316H, whereas the method 500 includes process 516H, where processes 316H and 516H are different in the two methods 300 and 500. Accordingly, the discussion below focuses on the process 516H of the method 500.

Referring to FIG. 5, prior to the process 516H, nanoribbons 118 of the LV device 101 and nanoribbons 668 of the HV device 251 are released, as illustrated in FIG. 6A. The devices of FIG. 6A are similar to corresponding devices of FIG. 4C, and formation of the devices of FIG. 6A is discussed in detail with respect to FIG. 3 and FIGS. 4A-4C.

Referring to FIG. 6A, at this stage of processing (i.e., where the nanoribbons 118 and 618 of the devices 101, 151, respectively, are released), the nanoribbons of both the devices have a height of hL and inter-nanoribbon vertical spacing of sL.

Referring again to FIG. 5, the method 500 proceeds from process 312H to 516H, where channel body material is deposited in the channel region of the HV device 251, to thicken two or more nanoribbons and to form a combined thick nanoribbon. In one embodiment, the deposition of the process 516H can be performed using any suitable deposition technique, such as such as chemical vapor deposition (CVD), physical vapor deposition (PVD), atomic layer deposition (ALD), vapor-phase epitaxy (VPE), molecular beam epitaxy (MBE), or liquid-phase epitaxy (LPE), for example. In an example, of the nanoribbons 668 comprise silicon, and silicon is deposited within the channel region of the HV device 251, to grow the nanoribbons 668 in the vertical z-axis direction, until the nanoribbons 668 are conjoined or merged to form the single nanoribbon 268.

FIG. 6B1 illustrates a first embodiment of the HV device 251, after the process 516H; and FIG. 6B2 illustrates a second embodiment of the HV device 251, after the process 516H. The LV device 101 is not illustrated in FIGS. 6B1 and 6B2, as the LV device 101 is not processed at this stage of processing. As seen in FIGS. 6B1 and 6B2, the nanoribbons 668 of FIG. 6A merge during the deposition stage, to form a monolithic single nanoribbon 268.

In the example of FIG. 6B1, the single nanoribbon 268 is not in contact with the underlying substrate 152. As discussed herein earlier with respect to FIG. 2B1, this gap may later be filed with dielectric layer 170 and/or the gate electrode 182. Thus, in this example and as illustrated in FIG. 2B1, the nanoribbon 268 is wrapped fully by the dielectric layer 170 and the gate electrode 182 on all four sides (where two other sides of the nanoribbon 168 are in contact with the source and drain regions).

In contrast, in FIG. 6B2, during the deposition process, the nanoribbon 268 is expanded enough to reach and be in contact with the underlying substrate 152. Thus, in this example, as seen in FIG. 2B2, the nanoribbon 268 is wrapped partially by the dielectric layer 170 and the gate electrode 182. For example, the dielectric layer 170 and the gate electrode 182 are on three sides of the nanoribbon 268, with the substrate 152 being on the fourth side of the nanoribbon 268 (where two other sides of the nanoribbon 168 are in contact with the source and drain regions).

In an example, during deposition of the channel body material to thicken and merge the multiple nanoribbons 668 to the single nanoribbon 268, one or more seams may be formed along junctions of the original nanoribbons 668 and the newly deposited channel body material, although FIG. 6B does not illustrate such seams. However, in another example, the deposition process is seamless, and no such seams are formed.

As seen in FIGS. 6B1 and 6B2, in the HV device 251, the gate spacers 184 at least partially protrude or extend through the nanoribbon 268. For example, the nanoribbon 268 is on a first sidewall, a second sidewall, and a third sidewall of at least a section of the gate spacers 184. In contrast, in the LV device 101 (e.g., see the LV device 101 of FIG. 1C), a specific nanoribbon (e.g., nanoribbon 118b) is on a single side of a specific section of the gate spacer 134. No section of the gate spacer 134 has a single nanoribbon on three sides.

Furthermore, the nanoribbon 268 comprise a plurality of tip regions 269 and a middle region 270, where each tip region 269 is in direct contact with either the source region 156 or the drain region 158, as illustrated in FIGS. 6B1, 6B2. The plurality of tip regions 269 and the middle region 270 are continuous sections of the nanoribbon 268. Two vertically adjacent tip regions 269 are separated by a section of the gate spacer 184, as illustrated in FIGS. 6B1, 6B2.

Note that each of the tip regions 269 of the nanoribbon 268 has a same height of hL, which is same as (e.g., within 5% of) the height of the tip and middle regions of the nanoribbons 118 of the LV device 101. Similarly, the inter-nanoribbon vertical space between the tip regions of the nanoribbon 268 is sL (see FIGS. 2C1, 2C2), which is same as the inter-nanoribbon vertical space between the tip/middle regions of the nanoribbon 118.

As discussed, the single nanoribbon 268 is formed by merging two or more nanoribbons 668, through a deposition process. Accordingly, a height of the middle region 270 of the nanoribbon 268 is at least twice a height of a middle region of the nanoribbon 668 (e.g., assuming at least two nanoribbons 668 are merged), or at least thrice a height of a middle region of the nanoribbon 668 (e.g., assuming at least three nanoribbons 668 are merged). Thus, in an example, the height of the middle region of the nanoribbon 268 is at least 200%, 225%, 250%, 300%, or 350% a height of a middle region of the nanoribbon 668, which is same as the height of a nanoribbon 118 of the LV device 101.

Referring again to FIG. 5, subsequent to the process 516H, the method 500 from proceeds from 312L to 320L and from 516H to 320H. Processes 320L and 320H and subsequent processes have been discussed already with respect to the method 300 of FIG. 3. At the end of process 324L, the LV device 101 is formed, as seen in FIG. 4F and various other figures. Similarly, at the end of process 324H, the HV device 251 is formed, as seen in FIGS. 2C1 and 2C2 (which illustrates the above discussed two different embodiments of the nanoribbon 268), as well as various other figures (e.g., FIGS. 2A, 2B1, and 2B2).

Example System

Figure 7:
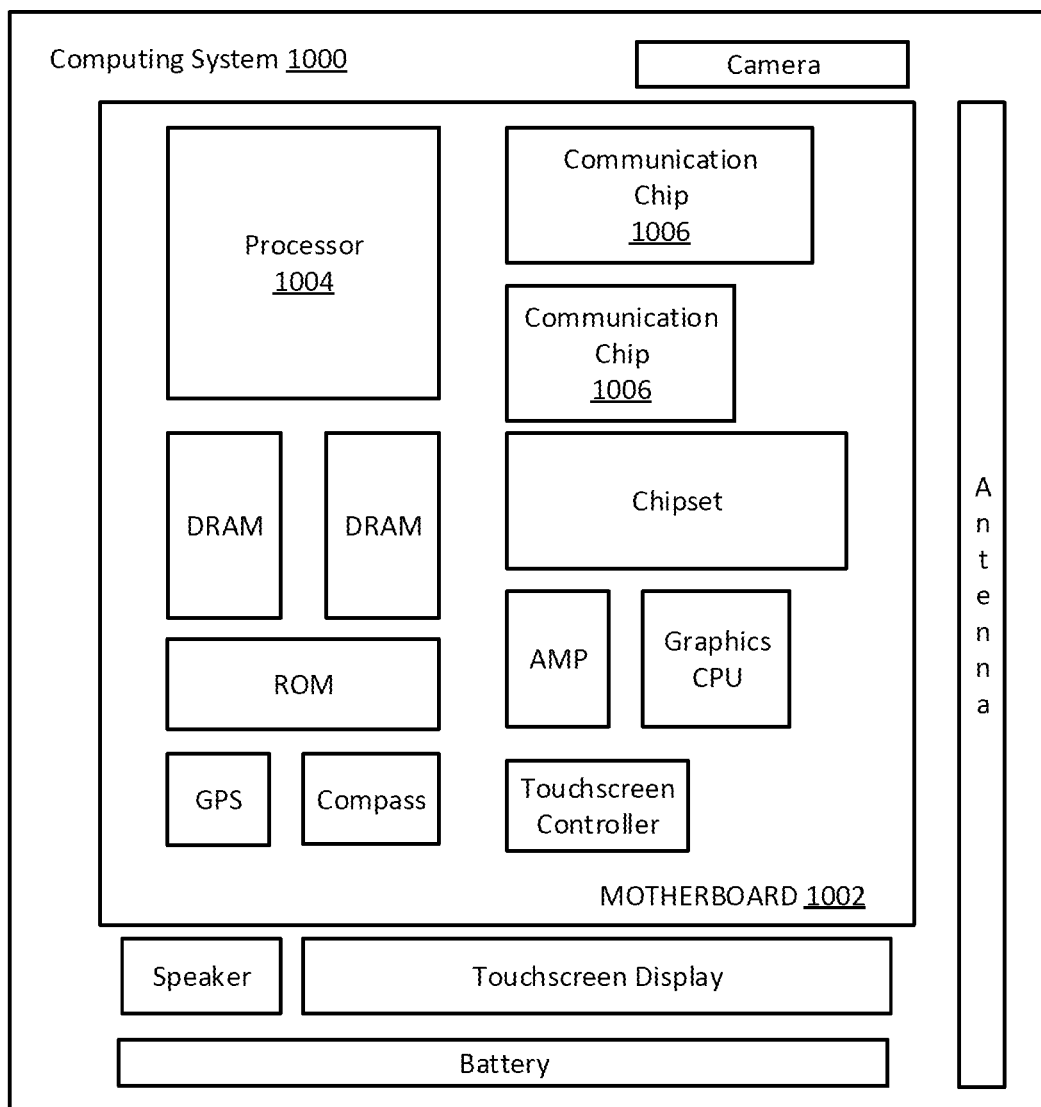
FIG. 7 illustrates a computing system implemented with integrated circuit structures and/or transistor devices formed using the techniques disclosed herein, in accordance with some embodiments of the present disclosure.

FIG. 7 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

FURTHER EXAMPLE EMBODIMENTS

The following clauses pertain to further embodiments, from which numerous permutations and configurations will be apparent.

Example 1. An integrated circuit structure comprising: a first non-planar semiconductor device comprising a first body comprising a semiconductor material, a first gate structure at least in part wrapped around the first body, the first gate structure including (i) a first gate electrode and (ii) a first gate dielectric between the first body and the first gate electrode, and a first source region and a first drain region, the first body having a length that extends laterally between the first source region and the first drain region; a second non-planar semiconductor device comprising a second body comprising a semiconductor material, a second gate structure at least in part wrapped around the second body, the second gate structure including (i) a second gate electrode and (ii) a second gate dielectric between the second body and the second gate electrode, and a second source region and a second drain region, the second body having a length that extends laterally between the second source region and the second drain region, wherein a first height of the first body is at least 5% different from a second height of the second body, wherein the first height is measured under the first gate structure and in a vertical direction that is perpendicular to the length of the first body, and the second height is measured under the second gate structure and in a vertical direction that is perpendicular to the length of the second body.

Example 2. The integrated circuit structure of example 1, wherein the first height of the first body is at least 10% more, or at least 10% less than the second height of the second body.

Example 3. The integrated circuit structure of any one of examples 1-2, wherein: the first body has a first tip region, a second tip region, and a first middle region between the first and second tip regions; the second body has a third tip region, a fourth tip region, and a second middle region between the third and fourth tip regions; and the first height of the first body is a height of the first middle region, and the second height of the second body is a height of the second middle region.

Example 4. The integrated circuit structure of example 3, wherein: a height of the first tip region of the first body is within 5% of a height of the third tip region of the second body.

Example 5. The integrated circuit structure of any one of examples 1-4, wherein: the first non-planar semiconductor device is rated for a first voltage of operation, and the second non-planar semiconductor device is rated for a second voltage of operation that is greater than the first voltage of operation; and the first height of the first body is greater than the second height of the second body.

Example 6. The integrated circuit structure of example 5, wherein: the first height of the first body is at least 5% more than the second height of the second body.

Example 7. The integrated circuit structure of example 5, wherein: the first height of the first body is at least 10% more than the second height of the second body.

Example 8. The integrated circuit structure of any one of examples 5-7, wherein: the second voltage of operation is greater than the first voltage of operation by at least 0.5 volts.

Example 9. The integrated circuit structure of any one of examples 1-8, wherein: the first non-planar semiconductor device comprises a first plurality of bodies that includes the first body; the second non-planar semiconductor device comprises a second plurality of bodies that includes the second body, wherein each body of the first and second pluralities of bodies include corresponding tip regions and a corresponding middle region between the corresponding tip regions; and a first vertical spacing between middle regions of two adjacent bodies of the first plurality of bodies is different from a second vertical spacing between middle regions of two adjacent bodies of the second plurality of bodies.

Example 10. The integrated circuit structure of example 9, wherein: the first non-planar semiconductor device is rated for a first voltage of operation, and the second non-planar semiconductor device is rated for a second voltage of operation that is greater than the first voltage of operation; and the first vertical spacing is smaller than the second vertical spacing.

Example 11. The integrated circuit structure of any one of examples 9-10 wherein: a third vertical spacing between corresponding tip regions of two adjacent bodies of the first plurality of bodies is within 5% of a fourth vertical spacing between corresponding tip regions of two adjacent bodies of the second plurality of bodies.

Example 12. The integrated circuit structure of any one of examples 1-11, wherein: the first non-planar semiconductor device comprises a first plurality of bodies that includes the first body; and the second non-planar semiconductor device comprises the second body and no other body.

Example 13. The integrated circuit structure of any one of examples 1-12, wherein: the first non-planar semiconductor device is rated for a first voltage of operation, and the second non-planar semiconductor device is rated for a second voltage of operation that is greater than the first voltage of operation; and the second height of the second body is greater than the first height of the first body.

Example 14. The integrated circuit structure of any one of examples 1-13, wherein: the second height of the second body is at least 200% more than the first height of the first body.

Example 15. The integrated circuit structure of any one of examples 1-13, wherein: the second height of the second body is at least 250% more than the first height of the first body.

Example 16. The integrated circuit structure of any one of examples 1-15, further comprising: a substrate, wherein the second non-planar semiconductor device is on the substrate, wherein the second body is directly on the substrate, and the second gate structure is partially, but not fully, wrapped around the second body.

Example 17. The integrated circuit structure of any one of examples 1-16, further comprising: a first gate spacer between the second source region and the second gate electrode, and a second gate spacer between the second drain region and the second gate electrode, wherein a corresponding section of each of the first gate spacer and the second gate spacer extend at least in part into within the second body, such that portions of the second body is above and below each of the first gate spacer and the second gate spacer.

Example 18. The integrated circuit structure of any one of examples 1-17, wherein: the second body comprises a first tip region and a second tip region in direct contact with the second source region; the first tip region and the second tip region extend from, and are continuous with, a middle region of the second body; and the first tip region and the second tip region are vertically separated by a gate spacer that is laterally between the second source region and the second gate electrode.

Example 19. The integrated circuit structure of any one of examples 1-18, wherein the first body is a nanoribbon, or a nanosheet.

Example 20. The integrated circuit structure of any one of examples 1-19, wherein the first body is part of a vertical stack including two or more nanosheets or nanoribbons.

Example 21. The integrated circuit structure of any one of examples 1-20, wherein one of the first and second non-planar semiconductor devices is a finFET device and the other of the first and second non-planar semiconductor devices is a gate-all-around transistor device.

Example 22. The integrated circuit structure of any one of examples 1-21, wherein one or both the first and second non-planar semiconductor devices is a gate-all-around transistor.

Example 23. The integrated circuit structure of any one of examples 1-22, wherein one or both the first and second non-planar semiconductor devices is a forksheet transistor.

Example 24. A semiconductor structure comprising: a body comprising a semiconductor material; a gate structure at least in part wrapped around the body, the gate structure including (i) a gate electrode and (ii) a gate dielectric between the body and the gate electrode; a source region and a drain region, the body laterally extending between the source and drain regions; and a gate spacer between the gate electrode and the source region, wherein the body comprises a plurality of tip regions extending from, and continuous with, a middle region of the body, and wherein a first tip region and a second tip region of the plurality of tip regions are (i) in direct contact with the source region, and (ii) vertically separated by the gate spacer.

Example 25. The semiconductor structure of example 24, wherein the gate spacer is a first gate spacer, and wherein the semiconductor structure further comprises: a second gate spacer between the gate electrode and the drain region, wherein a third tip region and a fourth tip region of the plurality of tip regions are (i) in direct contact with the drain region, and (ii) vertically separated by the second gate spacer.

Example 26. The semiconductor structure of any one of examples 24-25, wherein: a height of the middle region of the body is at least 200% greater than a height of the first tip region.

Example 27. The semiconductor structure of any one of examples 24-26, wherein: a section of the gate spacer extends into the body, such that the body surrounds the gate spacer on at least three sides.

Example 28. The semiconductor structure of any one of examples 24-27, wherein: a section of the gate spacer extends within the body, such that the body is on a first surface, a second surface, and a third surface of the gate spacer.

Example 30. The semiconductor structure of any one of examples 24-28, further comprising: a substrate, wherein the gate spacer and the body are in direct contact with the substrate.

Example 31. The semiconductor structure of any one of examples 24-30, wherein: the gate structure in part, but not fully, wraps around the body, such that the gate structure is on three surfaces of the body.

Example 32. The semiconductor structure of any one of examples 24-31, wherein: the gate structure fully wraps around the body.

Example 33. The semiconductor structure of any one of examples 24-32, wherein the body is a nanowire, a nanoribbon, or a nanosheet.

Example 34. A semiconductor structure comprising: a body comprising a semiconductor material, the body including a first tip region, a second tip region, and a middle region between the first and second tip regions; a gate structure at least in part wrapped around the body, the gate structure including (i) a gate electrode and (ii) a gate dielectric between the body and the gate electrode; and a source region and a drain region, the body laterally extending between the source and drain regions, the first and second tip regions of the body in direct contact with the source and drain regions, respectively, wherein a height of the first tip region in contact with the source region is at least 5% more than a height of the middle region.

Example 35. The semiconductor structure of example 34, wherein the height of the first tip region in contact with the source region is at least 10% more than the height of the middle region.

Example 36. The semiconductor structure of any one of examples 34-35, wherein a height of the second tip region in contact with the drain region is at least 5% more than the height of the middle region.

Example 37. The semiconductor structure of any one of examples 34-36, further comprising: a gate spacer between the gate electrode and the source region, wherein the gate spacer at least in part wraps around the first tip region.

Example 38. The semiconductor structure of example 37, wherein the gate spacer is a first gate spacer, and wherein the semiconductor structure further comprises: a second gate spacer between the gate electrode and the drain region, wherein the second gate spacer at least in part wraps around the second tip region.

Example 39. The semiconductor structure of any one of examples 34-38, wherein the gate dielectric and the gate electrode at least in part wraps around the middle region of the body.

Example 40. The semiconductor structure of any one of examples 34-39, wherein the body is a nanowire, a nanoribbon, or a nanosheet.

Example 41. A method of forming an integrated circuit structure comprising a high voltage (HV) device and a low voltage (LV) device, comprising: forming (i) for the LV device, a first plurality of bodies, and a first source region and a first drain region on two sides of the first plurality of bodies, and (ii) for the HV device, a second plurality of bodies, and a second source region and a second drain region on two sides of the second plurality of bodies; thinning each of the second plurality of bodies to form a corresponding plurality of thinned bodies, without thinning the first plurality of bodies; and forming (i) for the LV device, a first gate structure that at least in part wraps the first plurality of bodies, and (ii) for the HV device, a second gate structure that at least in part wraps the plurality of thinned bodies.

Example 42. The method of example 41, wherein: the first plurality of bodies includes a first body having a first tip region, a second tip region, and a first middle region between the first and second tip regions; the second plurality of bodies includes a second body having a third tip region, a fourth tip region, and a second middle region between the third and fourth tip regions; and a height of the first middle region is within 5% of a height of the second middle region.

Example 43. The method of example 42, wherein: a height of the first tip region is within 5% of a height of the third tip region.

Example 44. The method of any one of examples 42-43, wherein: the plurality of thinned bodies includes a thinned body formed by thinning the second body, the thinned body having a fifth tip region, a sixth tip region, and a third middle region between the fifth and sixth tip regions; and a height of the first middle region is at least 5% greater than a height of the third middle region.

Example 45. The method of example 44, wherein: a height of the first tip region is within 5% of a height of the fifth tip region.

Example 46. A method of forming an integrated circuit structure comprising a high voltage (HV) device and a low voltage (LV) device, comprising: forming (i) for the LV device, a first plurality of bodies, and a first source region and a first drain region on two sides of the first plurality of bodies, and (ii) for the HV device, a second plurality of bodies, and a second source region and a second drain region on two sides of the second plurality of bodies; depositing semiconductor material in a channel region of the HV device, to merge the second plurality of bodies and form a merged body, without depositing the semiconductor material in a channel region of the LV device; and forming (i) for the LV device, a first gate structure that at least in part wraps the first plurality of bodies, and (ii) for the HV device, a second gate structure that at least in part wraps the merged body.

Example 47. The method of example 46, wherein: a height of a middle region of the merged body is at least 200% greater than a height of a middle region of each of the first plurality of bodies.

Example 48. The method of any one of examples 46-47, wherein: a height of a middle region of each of the first plurality of bodies is within 5% of a height of a middle region of each of the second plurality of bodies.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit structure comprising:
   a first non-planar semiconductor device comprising
      a first plurality of bodies comprising a semiconductor material,
      a first gate structure at least in part wrapped around the first plurality of bodies, the first gate structure including (i) a first gate electrode and (ii) a first gate dielectric between the first plurality of bodies and the first gate electrode, and a first source region and a first drain region, each of the first plurality of bodies having a length that extends laterally between the first source region and the first drain region;
a second non-planar semiconductor device comprising
  a second plurality of bodies comprising a semiconductor material,
  a second gate structure at least in part wrapped around the second plurality of bodies, the second gate structure including (i) a second gate electrode and (ii) a second gate dielectric between the second plurality of bodies and the second gate electrode, and
  a second source region and a second drain region, each of the second plurality of bodies having a length that extends laterally between the second source region and the second drain region,
wherein a first height of a first body of the first plurality of bodies is at least 5% different from a second height of a second body of the second plurality of bodies, wherein the first height is measured under the first gate structure and in a vertical direction that is perpendicular to the length of the first body, and the second height is measured under the second gate structure and in a vertical direction that is perpendicular to the length of the second body,
wherein each body of the first and second plurality of bodies includes corresponding tip regions and a corresponding middle region between the corresponding tip regions, and
wherein a first vertical spacing between corresponding tip regions of two adjacent bodies of the first plurality of bodies is within 5% of a second vertical spacing between corresponding tip regions of two adjacent bodies of the second plurality of bodies.

2. The integrated circuit structure of claim 1, wherein the first height of the first body is at least 10% more, or at least 10% less than the second height of the second body.

3. The integrated circuit structure of claim 1, wherein:
the first body has a first tip region, a second tip region, and a first middle region between the first and second tip regions;
the second body has a third tip region, a fourth tip region, and a second middle region between the third and fourth tip regions; and
the first height of the first body is a height of the first middle region, and the second height of the second body is a height of the second middle region.

4. The integrated circuit structure of claim 3, wherein:
a height of the first tip region of the first body is within 5% of a height of the third tip region of the second body.

5. The integrated circuit structure of claim 1, wherein:
the first non-planar semiconductor device is rated for a first voltage of operation, and the second non-planar semiconductor device is rated for a second voltage of operation that is greater than the first voltage of operation; and
the first height of the first body is greater than the second height of the second body.

6. The integrated circuit structure of claim 5, wherein:
the first height of the first body is at least 5% more than the second height of the second body.

7. The integrated circuit structure of claim 1, wherein:
a third vertical spacing between middle regions of two adjacent bodies of the first plurality of bodies is different from a fourth vertical spacing between middle regions of two adjacent bodies of the second plurality of bodies.

8. The integrated circuit structure of claim 7, wherein:
the first non-planar semiconductor device is rated for a first voltage of operation, and the second non-planar semiconductor device is rated for a second voltage of operation that is greater than the first voltage of operation; and
the third vertical spacing is smaller than the fourth vertical spacing.

9. The integrated circuit structure of claim 1, wherein:
the first non-planar semiconductor device is rated for a first voltage of operation, and the second non-planar semiconductor device is rated for a second voltage of operation that is greater than the first voltage of operation; and
the second height of the second body is greater than the first height of the first body.

10. The integrated circuit structure of claim 1, further comprising:
a substrate, wherein the second non-planar semiconductor device is on the substrate.

11. The integrated circuit structure of claim 1, further comprising:
a first gate spacer between the first source region and the first gate electrode;
a second gate spacer between the first drain region and the first gate electrode;
a third gate spacer between the second source region and the second gate electrode;
and a fourth gate spacer between the second drain region and the second gate electrode,
wherein the first gate spacer and the second gate spacer are directly on the corresponding tip regions of the first plurality of bodies and the third gate spacer and the fourth gate spacer are directly on the corresponding tip regions of the second plurality of bodies.

12. A semiconductor structure comprising:
a body comprising a semiconductor material;
a gate structure at least in part wrapped around the body, the gate structure including (i) a gate electrode and (ii) a gate dielectric between the body and the gate electrode;
a source region and a drain region, the body laterally extending between the source and drain regions; and
a gate spacer between the gate electrode and the source region,
wherein the body comprises a plurality of tip regions extending from, and continuous with, a middle region of the body, and
wherein a first tip region and a second tip region of the plurality of tip regions are (i) in direct contact with the source region, and (ii) vertically separated by the gate spacer.

13. The semiconductor structure of claim 12, wherein the gate spacer is a first gate spacer, and wherein the semiconductor structure further comprises:
a second gate spacer between the gate electrode and the drain region,
wherein a third tip region and a fourth tip region of the plurality of tip regions are (i) in direct contact with the drain region, and (ii) vertically separated by the second gate spacer.

14. The semiconductor structure of claim 12, wherein:
a section of the gate spacer extends into the body, such that the body surrounds the gate spacer on at least three sides.

15. The semiconductor structure of claim 12, wherein:
a section of the gate spacer extends within the body, such that the body is on a first surface, a second surface, and a third surface of the gate spacer.

16. A semiconductor structure comprising:
a plurality of first bodies comprising a semiconductor material, the plurality of first bodies including corresponding first tip regions, second tip regions, and first middle regions between the first and second tip regions;
a first gate structure at least in part wrapped around the plurality of first bodies;
a first source region and a first drain region, the plurality of first bodies laterally extending between the first source and first drain regions, the first and second tip regions of the plurality of first bodies in direct contact with the first source and first drain regions, respectively,
a plurality of second bodies comprising a semiconductor material, the plurality of second bodies including corresponding third tip regions, fourth tip regions, and second middle regions between the third and fourth tip regions;
a second gate structure at least in part wrapped around the plurality of second bodies; and
a second source region and a second drain region, the plurality of second bodies laterally extending between the second source and second drain regions, the third and fourth tip regions of the plurality of second bodies in direct contact with the second source and second drain regions, respectively,
wherein a height of the first and second tip regions is at least 5% more than a height of the first middle region,
wherein a height of the third and fourth tip regions is substantially equal to a height of the second middle region, and
wherein a first vertical spacing between corresponding tip regions of two adjacent bodies of the plurality of first bodies is within 5% of a second vertical spacing between corresponding tip regions of two adjacent bodies of the plurality of second bodies.

17. The semiconductor structure of claim 16, wherein a height of the first and second tip regions is substantially equal to a height of the third and fourth tip regions.

18. The semiconductor structure of claim 16, wherein a height of the first middle region of a first body of the plurality of first bodies is at least 10% less than a height of the second middle region of a second body of the plurality of second bodies.

19. The semiconductor structure of claim 16, wherein a height of the first and second tip regions of the plurality of first bodies is within 5% of a height of the third and fourth tip regions of the plurality of second bodies.

20. The semiconductor structure of claim 16, the plurality of first bodies are part of a first semiconductor device that is rated for a first voltage of operation, and the plurality of second bodies are part of a second semiconductor device that is rated for a second voltage of operation that is lower than the first voltage of operation.

* * * * *